(12) United States Patent
Kwok et al.

(10) Patent No.: US 12,113,125 B2
(45) Date of Patent: Oct. 8, 2024

(54) BIPOLAR TRANSISTOR HAVING COLLECTOR WITH DOPING CONCENTRATION DISCONTINUITY

(71) Applicant: Skyworks Solutions, Inc., Irvine, CA (US)

(72) Inventors: Kai Hay Kwok, Burlington, MA (US); Cristian Cismaru, Newbury Park, CA (US); Andre G. Metzger, Newbury Park, CA (US); Guoliang Zhou, Walpole, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 71 days.

(21) Appl. No.: 17/809,855

(22) Filed: Jun. 29, 2022

(65) Prior Publication Data

US 2023/0006055 A1 Jan. 5, 2023

Related U.S. Application Data

(60) Provisional application No. 63/217,133, filed on Jun. 30, 2021, provisional application No. 63/217,116, filed on Jun. 30, 2021.

(51) Int. Cl.
*H01L 29/737* (2006.01)
*H01L 29/08* (2006.01)
*H01L 29/20* (2006.01)

(52) U.S. Cl.
CPC ...... *H01L 29/7371* (2013.01); *H01L 29/0821* (2013.01); *H01L 29/20* (2013.01)

(58) Field of Classification Search
CPC . H01L 29/7371; H01L 29/0821; H01L 29/20; H01L 29/205; H01L 29/36
See application file for complete search history.

(56) References Cited

U.S. PATENT DOCUMENTS

| | | |
|---|---|---|
| 9,054,065 B2 | 6/2015 | Zampardi, Jr. |
| 9,385,200 B2 | 7/2016 | Zampardi, Jr. et al. |
| 9,768,782 B2 | 9/2017 | Zampardi, Jr. |

(Continued)

OTHER PUBLICATIONS

Karoui et al., "An adaptive protection circuit for power amplifier ruggedness improvement," FRIC-S, 2005.

(Continued)

*Primary Examiner* — Syed I Gheyas
(74) *Attorney, Agent, or Firm* — Knobbe, Martens, Olson & Bear, LLP

(57) ABSTRACT

This disclosure relates to bipolar transistors, such as heterojunction bipolar transistors, having increased collector thickness for improved ruggedness. In some embodiments, the collector thickness can be above 1.1 microns. The collector can have at least one doping concentration grading. The collector can have a high doping concentration at a junction between the collector and the sub-collector, such as at the high end of the grading. In some embodiments, the high doping concentration can be above about $9 \times 10^{16}$ cm$^{-3}$. The collector can include a region with high doping concentration adjacent the base. The collector can include a discontinuity in the doping concentration, such as at the low end of the grading. Such bipolar transistors can be implemented, for example, in power amplifiers.

28 Claims, 9 Drawing Sheets

(56) References Cited

U.S. PATENT DOCUMENTS

| | | |
|---|---|---|
| 10,158,010 B2 | 12/2018 | Zampardi, Jr. et al. |
| 2013/0285120 A1* | 10/2013 | Zampardi, Jr. ....... H01L 29/737 |
| | | 257/586 |
| 2015/0255550 A1 | 9/2015 | Zampardi, Jr. et al. |
| 2021/0175328 A1* | 6/2021 | Zampardi ........... H01L 29/7371 |
| 2023/0006055 A1 | 1/2023 | Kwok et al. |
| 2023/0006056 A1 | 1/2023 | Kwok et al. |

OTHER PUBLICATIONS

Yamamoto et al., "A 3.2-V operation single-chip dual-band AlGaAs/GaAs HBT MMIC power amplifier with active feedback circuit technique," JSSC 35(8) 2000.

Niwa, et al., "A composite-collector InGaP/GaAs HBT with high ruggedness for GSM power amplifiers," MTT-S, 2003.

Humphreys, et al., "Control of avalanche injection in bipolar transistors through the use of graded collector impurity profiles," IEE Proc., 1987.

Zampardi, et al., "Characteristics of GaAs spike doped collectors," BCTM, 2012 (Article).

Zampardi, et al., "Characteristics of GaAs spike doped collectors," BCTM, 2012 (Slides).

* cited by examiner

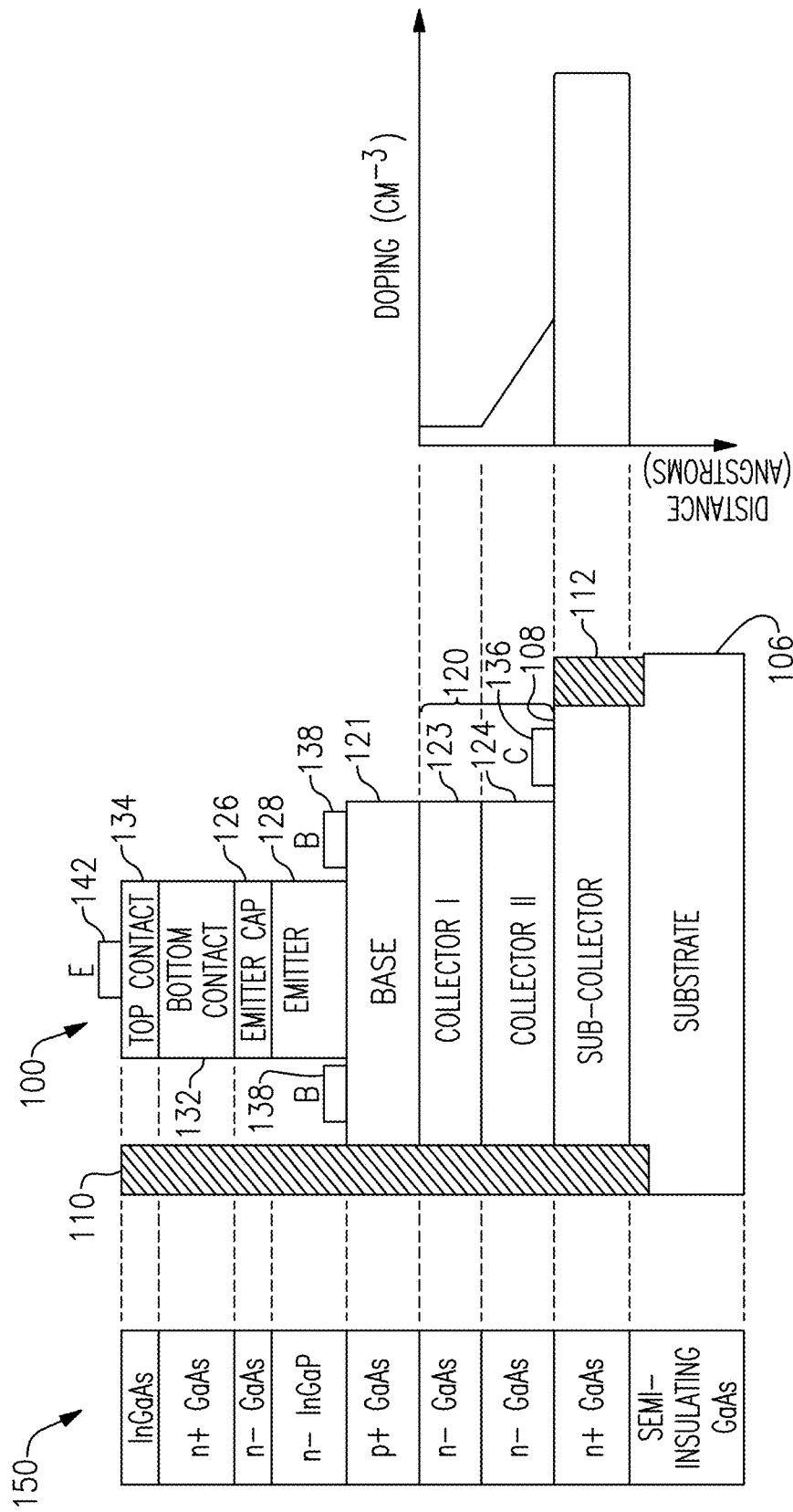

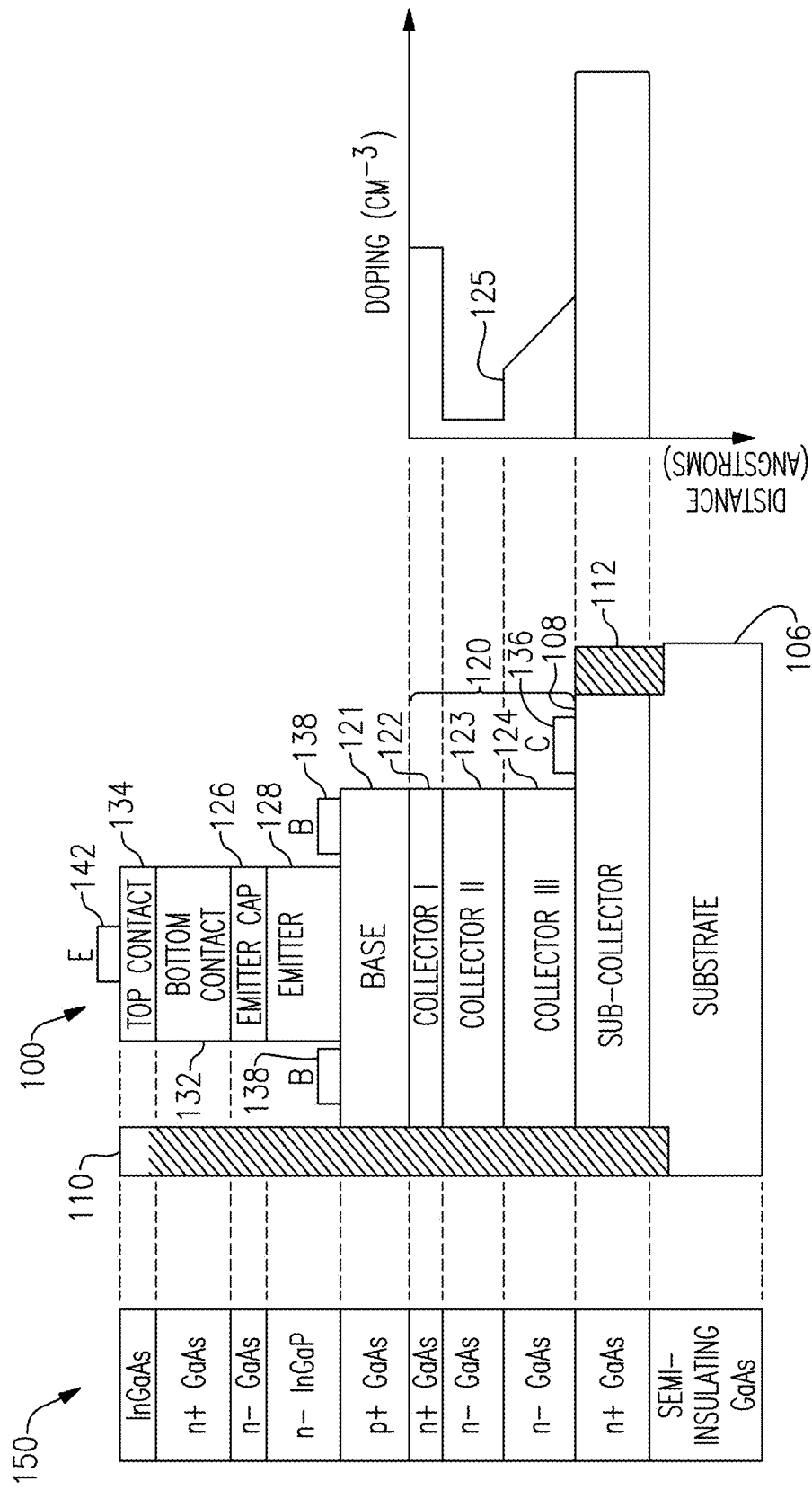

BIPOLAR TRANSISTOR HAVING COLLECTOR WITH DOPING CONCENTRATION DISCONTINUITY

BACKGROUND

Technical Field

The present disclosure relates to the field of semiconductor structures and, more particularly, to bipolar transistors and products that include bipolar transistors.

Description of the Related Technology

Bipolar transistors, such as heterojunction bipolar transistors (HBTs), are implemented in a wide variety of applications. Such bipolar transistors can be formed on semiconductor substrates, such as gallium arsenide (GaAs) substrates. One illustrative application for a bipolar transistor is in a power amplifier system. In some cases, specifications for power amplifier systems can be demanding to meet. Accordingly, a need exists for improved ruggedness in systems that include bipolar transistors, such as power amplifier systems.

SUMMARY OF CERTAIN INVENTIVE ASPECTS

The innovations described in the claims each have several aspects, no single one of which is solely responsible for its desirable attributes. Without limiting the scope of this invention, some prominent features will now be briefly discussed.

One aspect of this disclosure is a bipolar transistor that includes an emitter, a base, and a collector having a first collector region and a second collector region. The first collector region can be between the base and the second collector region. The first collector region can have a substantially flat doping concentration. The second collector region can have a doping concentration with a grading that increases from a first end of the second collector region (e.g., that is closest to the first collector region) to a second end of the second collector region (e.g., that is furthest from the first collector region).

In some embodiments, the second end of the second collector region can have the highest doping concentration in the collector. The collector can have a thickness of more than 1.1 microns. The collector can have a thickness in a range from about 1.2 microns to about 1.5 microns. The second end of the second collector region can have a doping concentration that is larger than $9 \times 10^{16}$ cm$^{-3}$. The second end of the second collector region can have a doping concentration that is in a range of about $1 \times 10^{17}$ cm$^{-3}$ to about $5 \times 10^{17}$ cm$^{-3}$. The collector can have a thickness in a range from about 1.2 microns to about 1.5 microns, and the second end of the second collector region can have a doping concentration that is in a range of about $1 \times 10^{17}$ cm$^{-3}$ to about $5 \times 10^{17}$ cm$^{-3}$. A doping concentration at the second end of the second collector region can be at least 13 times greater than a doping concentration at the first end of the second collector region. The graded doping concentration at the first end of the second collector region can be substantially the same as the substantially flat doping concentration of the first collector region. A transition from the flat doping concentration of the first collector region to the graded doping concentration of the second collector region can have a step in the doping concentration. The step can have a doping concentration increase of at least about $2 \times 10^{16}$ cm$^{-3}$.

The bipolar transistor can include a sub-collector. The collector can be between the base and the sub-collector. The second end of the second collector region can be closest to the sub-collector.

One aspect of this disclosure is a bipolar transistor that includes an emitter, a base, and a collector. The base can be between the emitter and the collector. The collector can have a first end closest to the base and a second end furthest from the base. The collector can have a doping concentration larger than $9 \times 10^{16}$ cm$^{-3}$ at the second end of the collector. The doping concentration at the second end of the collector can be less than or equal to about $5 \times 10^{17}$ cm$^{-3}$. The doping concentration at the second end of the collector can be in a range of about $1 \times 10^{17}$ cm$^{-3}$ to about $5 \times 10^{17}$ cm$^{-3}$. The collector can have a thickness of more than 1.1 microns. The collector can have a thickness in a range from about 1.2 microns to about 1.5 microns. The collector can have a first collector region and a second collector region. The first collector region can be between the base and the second collector region. The first collector region can have a substantially flat doping concentration. The second collector region can have a doping concentration with a grading that increases (e.g., along a direction from the first collector region toward the second end of the collector). A low end of the grading of the doping concentration in the second collector region can be substantially the same as the substantially flat doping concentration of the first collector region. A transition from the flat doping concentration of the first collector region to the graded doping concentration of the second collector region can have a step in the doping concentration. The step can have a doping concentration increase of at least about $2 \times 10^{16}$ cm$^{-3}$. The collector can have an additional collector region, which can be between the base and the first collector region. The additional collector region can have a doping concentration that is higher than the doping concentrations of the first collector region and the second collector region. The bipolar transistor can include a sub-collector. The collector can be between the base and the sub-collector. The second end of the collector can abut the sub-collector.

The bipolar transistor can be a heterojunction bipolar transistor (HBT). The bipolar transistor can be a GaAs-based transistor. A power amplifier can include any of the bipolar transistors disclosed herein. A mobile or fixed wireless device can include an antenna, a battery, and the power amplifier.

One aspect of this disclosure is a bipolar transistor that includes an emitter, a base, and a collector, which can have a first collector region and a second collector region. The first collector region can be between the base and the second collector region. The first collector region can have a flat doping concentration. The second collector region can have a graded doping concentration (e.g., that increases along a direction away from the base). A transition from the flat doping concentration of the first collector region to the graded doping concentration of the second collector region can have a step increase in the doping concentration. The step can have a doping concentration increase of at least about $2 \times 10^{16}$ cm$^{-3}$. The step can have a doping concentration increase in a range of about $2.5 \times 10^{16}$ cm$^{-3}$ to about $8.25 \times 10^{16}$ cm$^{-3}$.

The collector can include an addition collector region, such as between the base and the first collector region. The additional collector region can have a doping concentration that is higher than the doping concentrations of the first collector region and the second collector region. The bipolar transistor can have a step decrease in the doping concentration across the transition from the additional collector region and the first collector region. The collector can have a thickness of more than 1.1 microns. The collector can have a thickness in a range from about 1.2 microns to about 1.5 microns. The second collector region can have a maximum doping concentration that is larger than $9\times10^{16}$ cm$^{-3}$. The second collector region can have a maximum doping concentration that is in a range of about $1\times10^{17}$ cm$^{-3}$ to about $5\times10^{17}$ cm$^{-3}$. A maximum doping concentration of the second collector region can be at least 13 times greater than a doping concentration of the first collector region.

One aspect of this disclosure is a bipolar transistor that includes an emitter, a base, and a collector. The base can be between the collector and the emitter. The collector can have a gradient doping concentration and a discontinuity between the gradient doping concentration and lower doping concentration.

The discontinuity can include a step in the doping concentration of at least about $2\times10^{16}$ cm$^{-3}$. The discontinuity can include a step in the doping concentration in a range of about $2.5\times10^{16}$ cm$^{-3}$ to about $8.25\times10^{16}$ cm$^{-3}$. The collector can include a doping spike, which can have a doping concentration that is higher than the gradient doping concentration. The lower doping concentration can be between the doping spike and the gradient doping concentration. The bipolar transistor can have a discontinuity between the doping spike and the lower doping concentration. The collector can have a thickness of more than 1.1 microns. The collector can have a thickness in a range from about 1.2 microns to about 1.5 microns. The gradient doping concentration can have a maximum doping concentration that is larger than $9\times10^{16}$ cm$^{-3}$. The gradient doping concentration can have a maximum doping concentration that is in a range of about $1\times10^{17}$ cm$^{-3}$ to about $5\times10^{17}$ cm$^{-3}$. The gradient doping concentration can have a maximum doping concentration that is at least 13 times greater than the lower doping concentration.

The bipolar transistor can include a sub-collector. The collector can be between the base and the sub-collector. The bipolar transistor can be a heterojunction bipolar transistor (HBT). The bipolar transistor can be a GaAs-based transistor. A power amplifier can include any of the transistors disclosed herein. A mobile or fixed wireless device can include an antenna, a battery, and the power amplifier.

BRIEF DESCRIPTION OF THE DRAWINGS

FIG. 1A is a legend illustrating example materials corresponding to portions of the bipolar transistor of FIG. 1B.

FIG. 1B depicts an illustrative cross section of a bipolar transistor according to an embodiment.

FIG. 1C is a graph of example doping concentrations of portions of the bipolar transistor of FIG. 1A.

FIG. 3A is a legend illustrating example materials corresponding to portions of the bipolar transistor of FIG. 3B.

FIG. 3B depicts an illustrative cross section of a bipolar transistor according to another embodiment.

FIG. 3C is a graph of example doping concentrations of portions of the bipolar transistor of FIG. 3B.

DETAILED DESCRIPTION

Figure 2A:
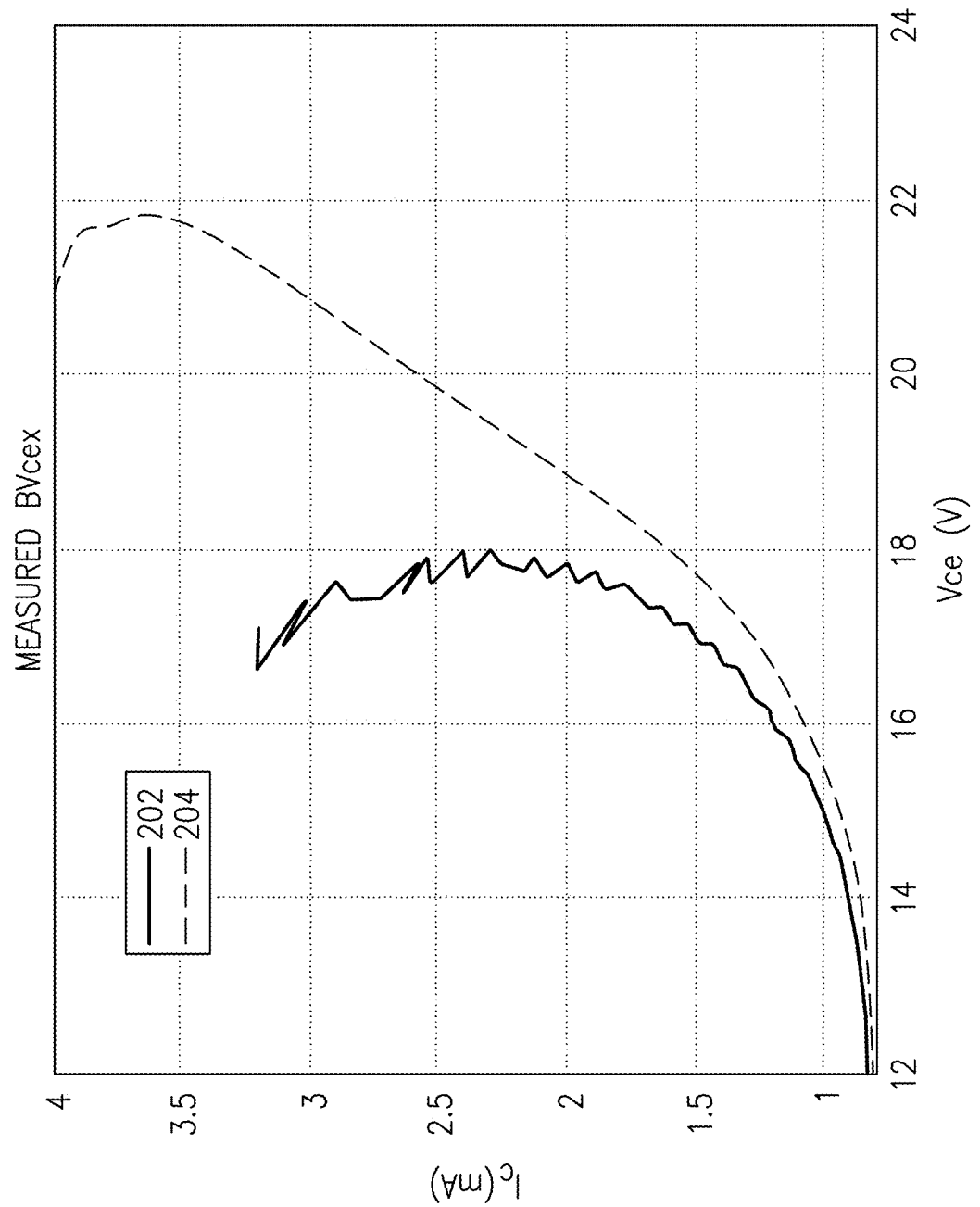
FIG. 2A is a graph of experimental data that illustrates the improved ruggedness of the bipolar transistor of FIG. 1B over a state of the art bipolar transistor.

Data transmission rates are expected to continue increasing with every component and system update, thus the reduction of distortion in power amplifier (PA) modules can be desirable. Modulation schemes with high data rates (for example, 5G or 5th Generation Wireless) generally require higher output power than previous generations. Similarly, to help with thermal management and preserve the system battery life, it can be beneficial to increase amplifier efficiency. To achieve lower cost and smaller form factor, design solutions often obtain the best performance when they push the physical limits of the GaAs-based HBTs in regards to electrical stress.

Amplifier linearity measurements can include channel power ratios, such as an adjacent channel power ratio (ACPR1) and an alternative channel power ratio (ACPR2), and/or channel leakage power ratios, such as an adjacent channel leakage power ratio (ACLR1) and an alternative channel leakage power ratio (ACLR2). ACPR2 and ACLR2 can be referred to as second channel linearity measurements. ACPR2 and ACLR2 values can correspond to measurements at an offset of about 1.98 MHz from a frequency of interest. Measurement of linearity can also include EVM (Error Vector Magnitude), a measure of modulation accuracy, represented by the variation in amplitude from input to output (AM-AM distortion) and variation in phase from input to output as a result of amplitude variation (AM-PM). EVM can also have dynamic elements (DEVM) and static elements (SEVM) as some elements of distortion can vary as a function of time. Even systems that use DPD (Digital Pre-Distortion) to help linearize the output can have several limitations such that the intrinsic linearity of the GaAs-based HBT amplifiers can benefit from meeting specific criteria.

In some situations, the most linear amplifier mode is Class-A, but some compact mobile handset GaAs HBT amplifiers target Classes and architectures that can obtain higher efficiency. In practice, some modern amplifiers operate in Class-AB or in switching modes such as Class-E when the output can be linearized with DPD or other means. Additional benefits in efficiency can be found with systems that raise or lower the output power supply Vcc using a separate or integrated PMIC (Power Management Integrated Circuit) such as a system that uses APT (Average Power Tracking) or ET (Envelope Tracking). As an example, when a handset battery's output is raised or lowered (e.g., from 3.4V) by a PMIC with Vcc provided by a buck-boost converter, efficiency can be improved. Some ET systems can use Vcc=5V or 5.5V when peak RF output power is desired such that the Class-E amplifier might have output collectors that see 3×Vcc at peak power. When compared to a system with Vcc fixed to 3.4V, it is apparent that such systems could greatly benefit from GaAs-based HBT devices that are more rugged, or that have a wider or larger Safe Operating Area (SOA).

The power amplifier's "ruggedness" can refer to a measure of the ability to survive an electrical stress event. In some cases, within limits, ruggedness can be increased with protection circuitry, although in some cases a component can have an intrinsic ruggedness without protection circuitry. We can describe and characterize an amplifier's safe operating range with progressive measurements that push stress conditions to find where the power amplifier fails. An amplifier that can survive higher stress conditions will be considered to be more rugged, and thus, less likely to succumb to a failure on the field. The full characterization of an amplifier's ruggedness involves multiple dimensions. Factors that can characterize ruggedness include: input power (in regards to how overdriving affects the output), output power, output mismatch (or VSWR—Voltage Standing Wave Ratio), output power supply (might be denoted as Vcc, Vdd, or Vbatt), and temperature. For any given topology, the power amplifier's ruggedness can be directly correlated to the SOA of the GaAs-based HBTs, however, the amplifier's ruggedness can be enhanced by over-stress protection circuitry. Protection circuitry is generally triggered by a high stress event, such as an excessively high voltage, excessive current draw, or excessive temperature where the trigger device might be a sensor on the GaAs-based HBT IC or another component in the same module. In some cases, the protection circuitry, which tends to limit, clip, or turn-off the amplifier, cannot be triggered where the circuit should be functioning linearly. And so, it would be also possible to define the range of operation where the amplifier can function linearly, which can be a range that can be captured within the same amplifier's safe operating range. The transistor's SOA can set the fundamental limit for both the maximum linear and safe operating ranges. Thus, it can be desirable to optimize the transistors for ruggedness. In particular, the collector design of GaAs-based HBTs can be important for improving the ruggedness of transistors.

For an individual transistor, the safe operating area (SOA) can be defined by the output curve of the transistor where the collector current (Ic) is plotted against the collector voltage (Vce). One of the metrics of SOA is $BV_{CEO}$, the breakdown voltage from collector to emitter with an open circuit at the base. $BV_{CEO}$ can be a direct current (DC) measurement. An important metric of the SOA is the snapback point of the output curve (BVcex, Ic_BVcex) which indicates the turning point of the transistor where the collector voltage starts decreasing while the collector current keeps increasing.

The ruggedness of a power amplifier can be an indication of how much power can be delivered while maintaining sufficient linearity, and/or what are the worst-case conditions the power amplifier can survive under. Generally, a power amplifier includes a matching circuit (such as for impedance matching). If the matching circuit is excessively mismatched with the transistor, sufficient power can be reflected back into the output and cause permanent damage to a transistor or devices in the amplifier output circuitry. Thus, a power amplifier that is able to operate and withstand a larger mismatch would have increased ruggedness. For example, some power amplifiers can be configured to withstand a mismatch ratio of 3 to 1, or 5 to 1, or 7 to 1, or 10 to 1, or more. Also, a higher amount of delivered power can result in more returned power that will increase the electrical stress on the output array and thus also increase the potential of part failing under test or on the field. Thus, a power amplifier that is required to operate linearly at higher power levels (e.g., produced by higher voltages) can benefit from having increased ruggedness to be able to function without breaking.

In some cases, ruggedness can be tested by using a set mismatch ratio (e.g., 10 to 1) and increasing the voltage (and resulting power) until the power amplifier breaks. For example, a power amplifier that was able to operate at 5.15 volts with a mismatch ratio of 10 to 1 would be considered to be more rugged than a power amplifier that breaks at 5 volts under the same conditions. Also, a power amplifier that was able to operate at the same voltage with a higher mismatch ratio would be considered to be more rugged than a power amplifier that can only operate under similar parameters but at a lower mismatch ratio. The temperature can also affect the ruggedness of the power amplifier. Generally, a power amplifier can fail more easily at lower ambient temperatures (e.g., within its operable range). For example, a power amplifier (e.g., with an operating range of −30 degrees C. to 85 degrees C. for the ambient temperature) may be to pass a ruggedness test (e.g., at 5.15 volts and a mismatch ratio of 10 to 1) at a relatively high temperature (e.g., 85 degrees C. or 30 degrees C.), whereas the power amplifier may fail to pass a similar ruggedness test with the same parameters (e.g., 5.15 volts and a mismatch ratio of 10 to 1) but at a relatively low temperature (e.g., −30 degrees C.). Thus, ruggedness tests can be performed at different temperatures and the worst-case temperature can be used to set the upper limits on output power, Vcc, and mismatch. The ruggedness of a power amplifier can be a description of the amount of RF power (or corresponding voltage) that the power amplifier can handle with a specified degree of mismatch and at a specified temperature.

A higher collector voltage (Vce) can result in improved efficiency for power amplifiers. A higher collector voltage Vce can also be used to produce higher power. However, a power amplifier may more easily break as its individual transistors operate at higher collector voltages and currents (e.g., as a result of the higher power levels), such as if operating beyond the SOA as defined primarily by the snapback point of the transistor output curves. Accordingly, some power amplifiers with improved ruggedness can have improved efficiency, such as by operating at higher voltages. In some embodiments, the collector thickness of a transistor can be increased to improve the ruggedness. However, increasing the collector thickness can degrade the performance of the power amplifier. In some embodiments, the doping concentration of the collector can be configured to compensate for the increased collector thickness to provide transistors and/or power amplifiers with improved ruggedness without degrading performance.

Generally described, aspects of the present disclosure relate to a bipolar transistor having a collector with a thickness of more than 1.1 microns. The collector can have a doping concentration of more than $9 \times 10^{16}$ cm$^{-3}$ at an end of the collector opposite the base (e.g., at the end of the collector adjacent to the sub-collector). The collector can have a flat doping concentration profile for a first collector region that abuts the base. The collector can have a graded doping concentration profile for a second collector region, with an increasing doping concentration moving away from the base. Properly selecting the grading(s) and the doping concentration in the collector can provide desirable RF performance for bipolar transistor while also providing improved ruggedness, especially compared to bipolar transistors with thinner collectors, or flat doped or step doped collectors, or lower doping concentrations.

Experimental and simulated data indicate that power amplifier systems that include such bipolar transistors can have improved ruggedness, increased safe operating area (SOA), and/or higher breakdown voltages, while maintaining desired performance parameter(s) (e.g., gain, linearity, and/or efficiency).

FIG. 1B shows an illustrative cross section of an example embodiment of a transistor 100, such as a bipolar transistor. As illustrated, the bipolar transistor 100 is a heterojunction bipolar transistor (HBT). The transistor 100 can be a single heterojunction bipolar transistor (SHBT). The transistor can also be a double heterojunction bipolar transistor with a portion or the whole collector made of material other than GaAs (or GaAs-based semiconductor), such as aluminium gallium arsenide (AlGaAs), indium gallium phosphide (InGaP), or other wide-bandgap semiconductors. The bipolar transistor 100 can be formed on a substrate 106. The substrate 106 can be a semiconductor substrate, such as a gallium arsenide (GaAs) substrate. Any other suitable substrate material can be used, such as silicon (Si). The bipolar transistor 100 can be disposed between isolation regions 110 and 112. Isolation regions 110 and 112 are non-conductive regions that can provide electrical isolation between the bipolar transistor 100 and an adjacent transistor or other circuit element. Isolations regions 110 and 112 can each include, for example, a trench filled with nitride, polyimide, or other material suitable for electrical isolation. Although not shown, it will be understood that one or more buffer layers can be included, such as between the substrate 106 and the sub-collector 108. The one or more buffer layers can include material that is semi-insulating, in some implementations (e.g., implant damaged material).

The bipolar transistor 100 can include a collector 120, a base 121, and an emitter 128. The collector 120 of the bipolar transistor 100 can include N doped compound semiconductor (for example, N doped GaAs, N doped AlGaAs, N doped InGaP). The collector 120 can include a plurality of collection regions having different doping profiles. For instance, the collector 120 can include a first collector region 123, which can be closest to (e.g., abutting) the base 121, and second collector region 124, which can be closest to (e.g., abutting) a sub-collector 108. The second collector region 124 can include at least one grading in which doping concentration increases away from the first collector region 123. The graded doping concentration can vary linearly or non-linearly (e.g., parabolically). FIG. 1C shows a linear grading, but the grading can be curved (e.g., convex or concave upward). As illustrated in FIG. 1B, the sub-collector 108 can be formed or positioned over the substrate 106, the second collector region 124 can be formed or position over the sub-collector 108, the first collector region 123 can be formed or positioned over the second collector region 124, the base 121 can be formed or positioned over the first collector region 124, and/or the emitter 128 can be formed or positioned over the base 121. The transistor 100 can include additional elements, as shown in FIG. 1B and/or as discussed herein. The positions described herein are in relation to the orientations illustrated in the figures, and various other orientations could be used.

A first end of the collector 120 can abut the base 121. A second end of the collector 120 that is opposite the first end can abut the sub-collector 108. A thickness of the collector 120 can represent the distance from the first end of the collector 120 to the second end of the collector 120. The collector thickness can also equivalently be referred to as the collector width, in some instances. In the bipolar transistor 100 illustrated in FIG. 1B, the collector thickness can be the distance from the interface between the collector 120 and the base 121 and the interface between the collector 120 and the sub-collector 108. In certain embodiments, the thickness of the collector 120 can be above 1.1 µm. The thickness of the collector 120 can be about 1.15 µm, about 1.2 µm, about 1.25 µm, about 1.3 µm, about 1.35 µm, about 1.4 µm, about 1.45 µm, about 1.5 µm, or any values or ranges therebetween (e.g., 1.2 µm to about 1.5 µm), although other thicknesses could also be used.

The emitter 128 can have a thickness in a range of about 0.02 µm to about 0.05 µm (although other suitable thicknesses could be used). The base 121 can have a thickness of about 0.05 µm to about 0.12 µm (although other suitable thicknesses could be used). The sub-collector 108 can have a thickness of about 0.6 µm to about 1.2 µm (although other suitable thicknesses could be used).

The first collector region 123 can abut the base 121 to form a collector-base junction. The collector-base junction can be a p-n junction. The first collector region 123 can include N− doped GaAs. The first collector region 123 can be a flat doped region. Thus, within the first collector region 123, the doping concentration can be substantially constant. In some embodiments, the flat doped portion 150 can have a doping concentration selected in the range from about $7 \times 10^{15}$ cm$^{-3}$ to about $1.5 \times 10^{16}$ cm$^{-3}$, although other doping concentrations could be used.

The second collector region 124 can include N− doped GaAs. The first doping concentration grading can span the second collector region 124. The doping concentration in the second collector region 124 can increase away from the base 121 and the first collector region 123. In some embodiments, the doping concentration of the second collector region 124 adjacent the first collector region 123 can begin at a doping concentration that is substantially the same as the doping concentration of the first collector region 123. The doping concentration of the second collector region 124 increase from a first, relatively low doping concentration at a first end of the second collector region 124 to a second, relatively high doping concentration at a second end of the second collector region 124. The first end of the second collector region 124 can be closest to the base or first collector region 123 (e.g., abutting the first collector region 123). The second end of the second collector region 124 can be at an opposite end from the first end, such as closest to or abutting the sub-collector 108. The first doping concentration at the first end of the second collection region 124 can be in a range from about $7 \times 10^{15}$ cm$^{-3}$ to about $1.5 \times 10^{16}$ cm$^{-3}$, although various other doping concentrations could be used. The second doping concentration at the second end of the second collection region 124 can be larger than $9 \times 10^{16}$ cm$^{-3}$. The second doping concentration can be about $9 \times 10^{16}$ cm$^{-3}$, about $9.1 \times 10^{16}$ cm$^{-3}$, about $9.25 \times 10^{16}$ cm$^{-3}$, about $9.5 \times 10^{16}$ cm$^{-3}$, about $9.75 \times 10^{16}$ cm$^{-3}$, about $1 \times 10^{17}$ cm$^{-3}$, about $1.5 \times 10^{17}$ cm$^{-3}$, about $2 \times 10^{17}$ cm$^{-3}$, about $2.5 \times 10^{17}$ cm$^{-3}$, about $3 \times 10^{17}$ cm$^{-3}$, about $3.5 \times 10^{17}$ cm$^{-3}$, about $4 \times 10^{17}$ cm$^{-3}$, about $4.5 \times 10^{17}$ cm$^{-3}$, about $5 \times 10^{17}$ cm$^{-3}$, or any values or ranges therebetween (e.g., between about $1 \times 10^{17}$ cm$^{-3}$ to about $5 \times 10^{17}$ cm$^{-3}$), although other doping concentrations could also be used.

The thickness of the first collector region 123 can be smaller than the thickness of the second collector region 124, although some embodiments could use other configurations. A ratio of the thickness of the first collector region 123 to the thickness of the second collector region 124 can be about 1 to 5, about 1 to 4, about 1 to 3, about 1 to 2.5, about 1 to 2, about 1 to 1.5, about 1 to 1.25, about 1 to 1, or any values or ranges therebetween, although other configurations could be used. The thickness of the first collector region 123 can be about 0.4 µm, about 0.45 µm, about 0.5 µm, about 0.55 µm, about 0.6 µm, about 0.65 µm, about 0.7 µm, about 0.75 µm, about 0.8 µm, or any values or ranges therebetween, although other thicknesses could also be used. The thickness of the second collector region 124 can be about 0.7 µm, about 0.75 µm, about 0.8 µm, about 0.85 µm, about 0.9 µm, about 0.95 µm, about 1 µm, about 1.05 µm, about 1.1 am, or any values or ranges therebetween, although other thicknesses could also be used.

The base 121 of the bipolar transistor 100 can include P doped GaAs-based (for example, P+ doped GaAs, P+ doped gallium arsenide antimonide (GaAsSb), P+ doped gallium arsenide indium nitride (GaAsInN), P+ doped gallium indium arsenide (GaInAs), P+ doped gallium arsenide phosphide antimonide (GaAsPSb)). The base 121 can have a substantially flat doping. In certain implementations, the doping concentration of the base 121 can be selected in a range from about $2\times10^{19}$ cm$^{-3}$ to $7\times10^{19}$ cm$^{-3}$, although other doping concentrations could be used in some embodiments. The thickness of the base 121 can be selected in the range from about 0.035 microns to about 0.14 microns, or 0.05 microns to about 0.12 microns, or 0.05 microns to about 0.09 microns, according to certain implementations, or any values or ranges between any of those thickness values. Any base thicknesses selected from the ranges disclosed herein can be implemented in combination with any of the base doping concentrations selected from the ranges disclosed herein. As one example, the base 121 can have a doping concentration of $5.5\times10^{19}$ cm$^{-3}$ and a thickness of 500 Å (0.05 microns). In the bipolar transistor 100 of FIG. 1A, thickness can be the shortest distance between the emitter 128 and the collector 120 (e.g., the first collector region 123). Any suitable configuration for the base 121 can be used.

The bipolar transistor 100 can include a collector contact 136 to the collector, base contact(s) 138 to the base 121, and an emitter contact 142 to the emitter 126. These contacts can provide an electrical connection to and/or from the bipolar transistor 100. The contacts 136, 138, and 142 can be formed of any suitable conductive material. As illustrated in FIG. 1B, the emitter contact 142 can be disposed over a top contact 134, a bottom contact 132, and an emitter cap 126.

The bipolar transistor 100 can include a sub-collector 108 over the substrate 106. The sub-collector 108 can be under the collector 120. As illustrated in FIG. 1B, the sub-collector 108 can be disposed between the collector 120 and the substrate 106. The sub-collector 108 can abut the second end of the collector 120, the second collector region 124 (e.g., the second end thereof). The sub-collector 108 can be a flat doped region. The sub-collector 108 can have a doping concentration on the order of $1\times10^{18}$ cm$^{-3}$, such as in a range of about $1\times10^1$ cm$^{-3}$ to about $1\times10^{19}$ cm$^{-3}$, or a range of about $2.25\times10^{18}$ cm$^{-3}$ to about $7.75\times10^{18}$ cm$^{-3}$, or about $5\times10^{18}$ cm$^{-3}$, or any values or ranges between any of these values, although other configurations could be used. The sub-collector 108 can have a thickness of about 8000 Å (0.8 microns) in certain embodiments, or within a range of about 0.6 microns to about 1.2 microns, although other configurations could be used. The collector contact 136 can physically contact the sub-collector 108 to provide an electrical connection to the collector 120.

FIG. 1A is a legend 150 illustrating example materials corresponding to portions of the bipolar transistor 100 of FIG. 1B. Dashed lines between FIG. 1A and FIG. 1B are included to indicate that materials in the legend 150 correspond to particular portions of the bipolar transistor 100. The legend 150 indicates that, in certain embodiments, the substrate 108 can be semi-insulating GaAs, the sub-collector 120 can be N+ GaAs, the second collector region 124 can be N− GaAs, the first collector region 123 can be N− GaAs, the base 121 can be P+ GaAs or GaAs-based semiconductor, the emitter 128 can be N− InGaP, the emitter cap 126 can be N− GaAs, the bottom contact 132 can be N+ GaAs, and the top contact 134 can be InGaAs. In some embodiments, one or more of the regions of the bipolar transistor 100 can include a suitable alternative material instead of the example materials provided in the legend 150. For example, in certain embodiments, the substrate 106 can be silicon germanium (SiGe) and one or more other regions of the bipolar transistor 100 can also include Si and/or SiGe. Moreover, in any of the bipolar transistors described herein n-type doping and p-type doping can be interchanged throughout some or all of the transistor. Thus, any combination of features described herein can be applied to NPN transistors and/or PNP transistors.

In some embodiments, the maximum doping concentration of the second collector region 124 (or of the entire collector 120) can be about one order of magnitude lower than the doping concentration of the sub-collector 108. For example, the maximum doping concentration of the second collector region 124 can be about $5\times10^{17}$ cm$^{-3}$ and the doping concentration of the sub-collector 108 can be about $5\times10^{18}$ cm$^{-3}$. The doping concentration of the sub-collector 108 can be about 1.25 times, about 1.5 times, about 1.75 times, about 2 times, about 2.5 times, about 3 times, about 4 times, about 5 times, about 6 times, about 7 times, about 7.5 times, about 8 times, about 8.5 times, about 9 times, about 9.5 times, about 10 times, about 10.5 times, about 11 times, about 11.5 times, about 12 times, about 12.5 times, about 13 times, about 14 times, or about 15 times greater than the maximum doping concentration of the second collector region 124 (or of the entire collector 120), or any values or ranges therebetween, although other configurations are possible. In some embodiments, the maximum doping concentration of the second collector region 124, or of the entire collector 120, (e.g., the high end of the grading) can be about 5 times, about 6 times, about 7 times, about 8 times, about 9 times, about 10 times, about 11 times, about 12 times, about 13 times, about 15 times, about 17 times, about 20 times, about 25 times, about 30 times, about 35 times, about 40 times, about 45 times, about 50 times, about 60 times, about 70 times, about 80 times greater than the flat doping concentration of the first collector region 123 (or than low end of the grading of the second collector region 124), or any values or ranges therebetween, although other configurations are possible.

Increasing the thickness of the collector 120 can expand the SOA of the transistor 100 and/or improve the ruggedness of power amplifiers that use the transistor 100. However, increasing the thickness of the collector 120 can increase the collector transit time ($t_C$) and can reduce the base-collector capacitance ($C_{BC}$), which can degrade or otherwise change the performance of the transistor and corresponding power amplifier. Increasing the doping concentration of the collector 120 (e.g., by increasing the steepness of the graded doping concentration in the second collector region, or otherwise raising the doping concentration on the high side of the gradient) can increase $C_{BC}$ and thus at least partially offset the $C_{BC}$ reduction due to the increased thickness of the collector 120. Also, the increased doping concentration of the collector 120 can reduce the collector resistance ($R_C$) which can at least partially compensate for the increased collector transit time ($t_C$). Thus, increasing the collector doping concentration can at least partially compensate for the increased collector thickness, resulting in a transistor that can provide improved ruggedness without degrading the power amplifier performance (e.g., gain, efficiency, and linearity).

Experimental data indicate that a power amplifier system including the bipolar transistor 100 of FIG. 1B can improve the ruggedness of the power amplifier while maintaining performance parameters (e.g., gain, linearity, and/or efficiency). Moreover, measurements or simulation indicate that the bipolar transistor 100 of FIG. 1B has a desirable safe operating region (SOA).

Figure 4A:
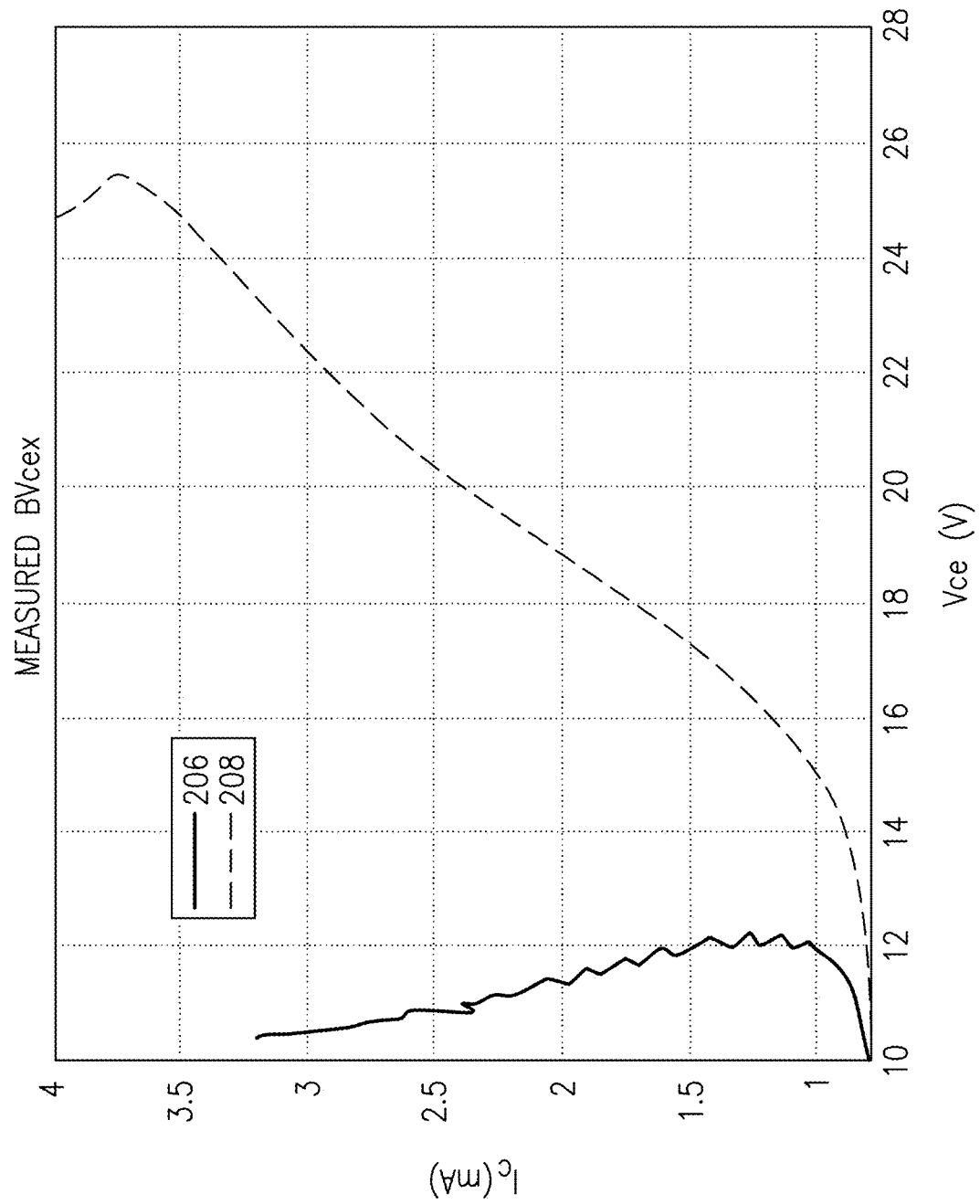
FIG. 4A is a graph of experimental data that illustrates the improved ruggedness of the bipolar transistor of FIG. 3B over a state of the art bipolar transistor.

FIG. 2A is a graph that shows measurements taken from experimental results for a state of the art transistor (shown as a solid line 202) and for a transistor having the design of transistor 100 in FIG. 1B (shown as a dashed line 204). In FIGS. 2A and 4A, the X-axis corresponds to the collector-emitter voltage (Vce), and the Y-axis corresponds to the collector current. As the collector current increases, the voltage increases as the peak electric field increases, until a threshold current Ic_BVcex is reached. At that threshold, the peak electric field has shifted from the base-collector junction towards the collector-subcollector interface. Increasing the current past the threshold or snapback point can cause the voltage Vce to decrease. Increasing the collector thickness and the doping concentration at the second end of the second collector region 124 can push the snapback point towards the top right corner of the Ic-Vce plot in some embodiments. However, increasing the concentration too far may shrink the SOA region below snapback current Ic_BVcex. The concentration can be increased up to the point where $C_{BC}$ remains intact, for example.

For the transistor corresponding to line 202 in FIG. 2A, the voltage can increase to about 18 V as the current increases, at which point a breakdown causes the voltage (Vce) to reduce as the current continues to increase above the threshold. By comparison, for a transistor 100 having features disclosed herein corresponding to line 204, the voltage can increase to about 22 V as the current increases, at which point the breakdown causes the voltage (Vce) to reduce as the current increases. For line 202, the snapback current is at about 2.3 mA, and for line 204, the snapback point is at about 3.6 mA. Thus, the transistor design of FIG. 1B can shift the snapback point upward and to the top right in the graph of FIG. 2A, which can increase the safe operating area (SOA). The transistor designs disclosed herein can defer the snapback and can increase the ruggedness of power amplifiers.

Figure 2B:
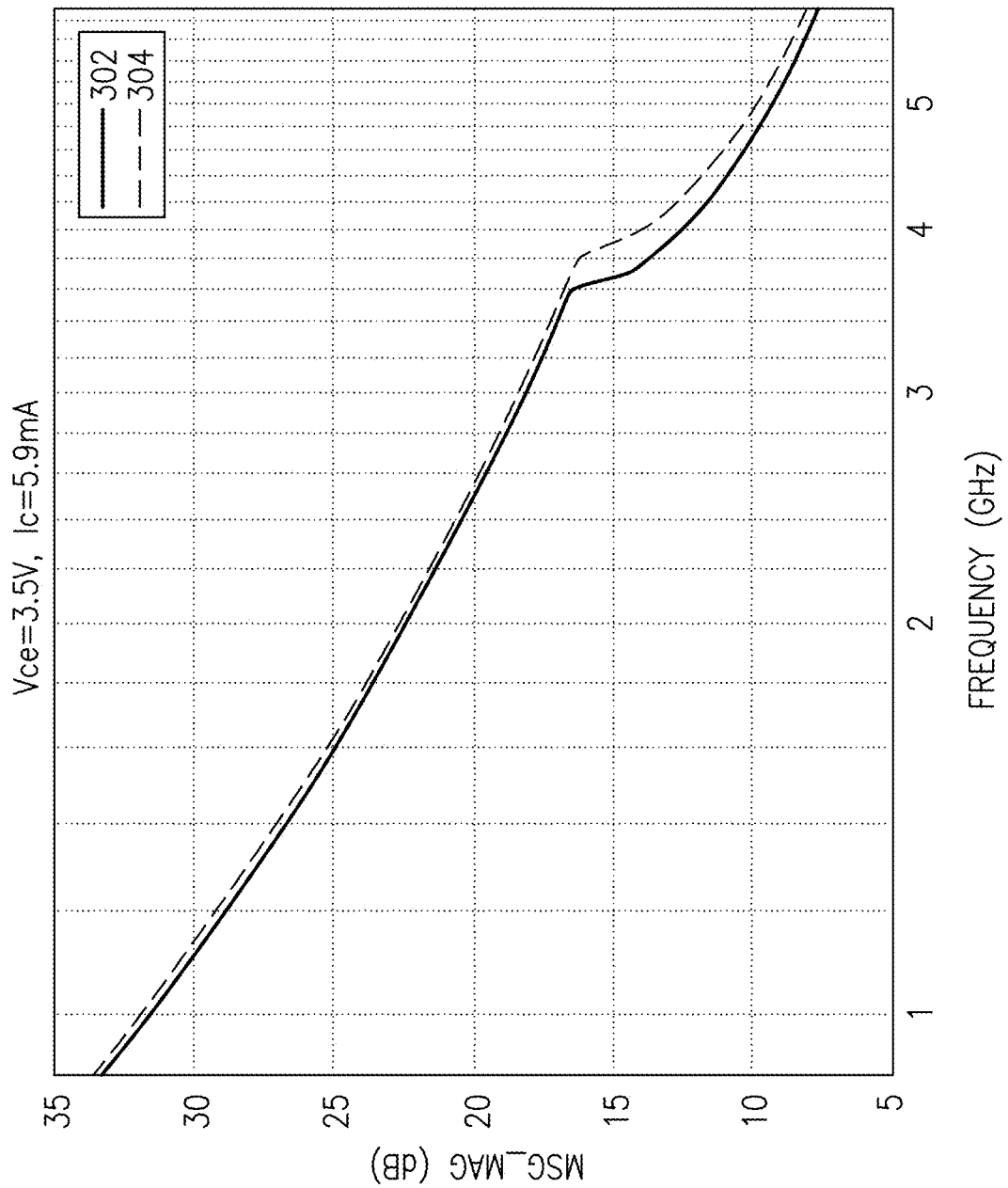
FIG. 2B is a graph of experimental data that shows substantially no degradation in the RF gain of a bipolar transistor of FIG. 1B over a state of the art bipolar transistor.

FIG. 2B compares the RF gain of the transistor 100 (corresponding to line 304) of FIG. 1B and that of a state of the art transistor (corresponding to line 302) and confirms substantially no performance degradation due to the increased collector thickness and higher doping concentration at the second end of the second collector region 124.

FIG. 3B depicts an illustrative cross section of a bipolar transistor 300 according to another embodiment. The bipolar transistor 300 of FIG. 3B is substantially the same as the bipolar transistor 100 of FIG. 1B except as described herein. The collector 120 can include a first collection region 122, which can include a doping concentration that is higher than the doping concentrations as other portions of the collector 120. The collector 120 can have a step or discontinuity in the doping concentration at an interface between a collector region having a flat doping concentration profile and another collector region with a graded doping concentration profile. FIG. 3C is a graph that shows illustrative doping concentrations of portions of the bipolar transistor 300 of FIG. 3B.

The bipolar transistor 300 can include a collector 120 having a first collector region 122, a second collector region 123, and a third collector region 124. The second collector region 123 can include any combination of features described with reference to the first collector region 123 of FIG. 1B. The third collector region 124 can include any combination of features described with reference to the second collector region 124 of FIG. 1B.

The first collector region 122 can abut the base 121 to form a collector-base junction. The collector-base junction can be a p-n junction. The first collector region 122 can include N+ doped GaAs. The first collector region 122 can be a flat doped region. Thus, within the first collector region 122, the doping concentration can be substantially constant. The doping concentration in the first collector region 122 of the bipolar transistor 300 can influence linearity of a system that includes the bipolar transistor 300. For instance, the doping concentration of the first collector region 122 together with the thickness of the first collector region 122 can influence ACPR2 and/or ACLR2 of a power amplifier system. Lower doping concentrations of the first collector region 122 together with smaller thickness of the first collector region 122 may not achieve a desired level of ACPR2 and/or ACLR2. On the other hand, higher doping concentrations of the first collector region 122 together with larger thickness of the first collector region 122 may degrade a gain of the bipolar transistor 300 such that a system including the bipolar transistor 300 does not meet gain specifications, such as RF gain specifications. In view of this trade-off, particular values of the doping concentration of the first collector region 122 and the thickness of the first collector region 122 may need to be selected to achieve both a desired gain and a desired linearity. As one example, for a GaAs bipolar transistor 300, the first collector region 122 can have a doping concentration of $6 \times 10^{16}$ cm$^{-3}$ and a thickness of 2000 Å (0.2 microns). Various other configurations could be used for the first collector region 122.

In some embodiments, the first collector region 122 can have a doping concentration of at least about $3 \times 10^{16}$ cm$^{-3}$, at least about $3.5 \times 10^{16}$ cm$^{-3}$, at least about $4 \times 10^{16}$ cm$^{-3}$, at least about $4.5 \times 10^{16}$ cm$^{-3}$, at least about $5 \times 10^{16}$ cm$^{-3}$, at least about $5.5 \times 10^{16}$ cm$^{-3}$, at least about $6 \times 10^{16}$ cm$^{-3}$, at least about $6.5 \times 10^{16}$ cm$^{-3}$, at least about $7 \times 10^{16}$ cm$^{-3}$, at least about $7.5 \times 10^{16}$ cm$^{-3}$, at least about $8 \times 10^{16}$ cm$^{-3}$, at least about $8.5 \times 10^{16}$ cm$^{-3}$, or at least about $9 \times 10^{16}$ cm$^{-3}$, or any values or ranges between these doping concentration values, although other configurations are possible. According to certain embodiments, the first collector region 122 can have a doping concentration selected within one of the following ranges: about $3 \times 10^{16}$ cm$^{-3}$ to $9 \times 10^{16}$ cm$^{-3}$, about $3 \times 10^{16}$ cm$^{-3}$ to $8 \times 10^{16}$ cm$^{-3}$, about $3 \times 10^{16}$ cm$^{-3}$ to $7 \times 10^{16}$ cm$^{-3}$, about $3 \times 10^{16}$ cm$^{-3}$ to $6 \times 10^{16}$ cm$^{-3}$, about $3 \times 10^{16}$ cm$^{-3}$ to $5 \times 10^{16}$ cm$^{-3}$, about $4 \times 10^{16}$ cm$^{-3}$ to $9 \times 10^{16}$ cm$^{-3}$, about $4 \times 10^{16}$ cm$^{-3}$ to $8 \times 10^{16}$ cm$^{-3}$, about $4 \times 10^{16}$ cm$^{-3}$ to $7 \times 10^{16}$ cm$^{-3}$, about $4 \times 10^{16}$ cm$^{-3}$ to $6 \times 10^{16}$ cm$^{-3}$, about $4 \times 10^{16}$ cm$^{-3}$ to $5 \times 10^{16}$ cm$^{-3}$, about $5 \times 10^{16}$ cm$^{-3}$ to $9 \times 10^{16}$ cm$^{-3}$, about $5 \times 10^{16}$ cm$^{-3}$ to $8 \times 10^{16}$ cm$^{-3}$, about $5 \times 10^{16}$ cm$^{-3}$ to $7 \times 10^{16}$ cm$^{-3}$, about $5 \times 10^{16}$ cm$^{-3}$ to $6 \times 10^{16}$ cm$^{-3}$, about $6 \times 10^{16}$ cm$^{-3}$ to $9 \times 10^{16}$ cm$^{-3}$, about $6 \times 10^{16}$ cm$^{-3}$ to $8 \times 10^{16}$ cm$^{-3}$, about $6 \times 10^{16}$ cm$^{-3}$ to $7 \times 10^{16}$ cm$^{-3}$, about $7 \times 10^{16}$ cm$^{-3}$ to $9 \times 10^{16}$ cm$^{-3}$, about $7 \times 10^{16}$ cm$^{-3}$ to $8 \times 10^{16}$ cm$^{-3}$, or about $8 \times 10^{16}$ cm$^{-3}$ to $9 \times 10^{16}$ cm$^{-3}$.

The thickness of the first collector region 122 can be selected in the range from about 500 Å to 4000 Å in accordance with certain embodiments. In some of these embodiments, the thickness of the first collector region 122 can be selected within one of the following ranges: about 500 Å to 1000 Å, about 1000 Å to 2000 Å, about 1000 Å to 3000 Å, about 1500 Å to 2000 Å, about 2000 Å to 3000 Å, about 2000 Å to 4000 Å, about 2500 Å to 4000 Å, or about 3000 Å to 4000 Å. Any of these thickness ranges can be implemented in combination with any of the doping concentrations discussed earlier. In the bipolar transistor 300 of FIG. 3B, the thickness of the first collector region 122 can be measured as a shortest distance between the base 121 and the second collector region 123.

Higher doping concentrations in the first collector region 122 can reduce the RF gain of the bipolar transistor 300. In order to meet RF gain specifications of a system that includes the bipolar transistor 300, such as a power amplifier system, other changes to features of the bipolar transistor 300 may need to counteract such a decrease in RF gain. One or more gradings in the collector (e.g., in the third collector region 124) of the bipolar transistor 300 can compensate for some or all of the losses in RF gain associated with a higher doping concentration in the first collector region 122. At the same time, ACPR2 and/or ACLR2 specifications of a power amplifier system that includes the bipolar transistor 300 can still be met.

In order to meet RF gain specifications of a system, such as a power amplifier system, that includes the bipolar transistor 300, the single grading in the collector 120 of the bipolar transistor 300 can compensate for some or all of the losses in RF gain associated with a higher doping concentration in the first collector region 122. At the same time, ACPR2 and/or ACLR2 specifications of a power amplifier system that includes the bipolar transistor 300 can still be met. The collector 120 can include a second collector region 123 and a third collector region 124, as illustrated in FIGS. 3A and 3B. In other embodiments, for example, the flat doped portion (e.g., the second collector portion 123) can be omitted from the collector 120. In some embodiments, the first collector region 122 can be omitted. Additional details that can apply to the transistors disclosed herein, such as regarding the relatively high doped first collector region and related features such as the graded doping, are disclosed in U.S. Pat. No. 9,768,282, issued Sep. 19, 2017 and titled BIPOLAR TRANSISTOR HAVING COLLECTOR WITH GRADING, which is hereby incorporated by reference. In some embodiments, the first collector region 122 can be a doping spike. Additional details that can apply to the transistors disclosed herein, such as regarding the doping spike of the first collector region and related features such as the graded doping, are disclosed in U.S. Pat. No. 9,385,200, issued Jul. 5, 2016 and titled BIPOLAR TRANSISTOR HAVING COLLECTOR WITH DOPING SPIKE, which is hereby incorporated by reference.

As illustrated in FIG. 3B, the collector 120 can include a second collector region 123, which can have a flat doping. The second collector region 123 can include N– doped GaAs. In some embodiments, the doping concentration of the second collector region 123 has at a doping concentration that is about one order of magnitude lower than the doping concentration of the first collector region 122. According to certain embodiments, the doping concentration of the second collector region can be selected from the range of about $7.5\times10^{15}$ $cm^{-3}$ to $1.5\times10^{16}$ $cm^{-3}$, although other concentrations may be used in other implementations. The second collector region 123 can have a thickness selected from the range from about 2000 Å to 4000 Å, although other thicknesses are possible. Various features and details of the first collector region 123 of the transistor 100 of FIG. 1B can apply to the second collector region 123 of the transistor 300 of FIG. 3B. In some embodiments, the doping concentration of the second collector region 123 can be lower than the doping concentration at which the third collector region 124 begins to grade. This can produce a discontinuity in doping associated with the collector 120, as discussed herein. In some embodiments, the doping concentration of the second collector region 123 can be substantially the same as the doping concentration at which the third collector region 124 begins to grade, which can avoid the discontinuity.

The third collector region 124 can include N– doped GaAs. A single grading can span the third collector region 124. In other embodiments, multiple grading regions can be used, e.g., with different grading rates. The doping concentration in the third collector region 124 can increase away from the base 121, away from the first collector region 122, and/or away from the second collector region 123. The doping concentration of the third collector region 124 adjacent the second collector region 123 can have a doping concentration that is approximately higher than the doping concentration of the second collector region 123, which can produce a step 125 or discontinuity at the interface between the second collector region 123 and the third collector region 124. The third collector region 124 can have a thickness selected from the range from about 4000 Å to 10,000 Å. The doping concentration in the third collector region 124 can grade from about $7.5\times10^{15}$ $cm^{-3}$ to about $8\times10^{16}$ $cm^{-3}$ or more at an interface with the second collector region 123 to at least about $1\times10^{17}$ $cm^{-3}$ at an interface with the sub-collector 108. In some embodiments, the doping concentration at the interface with the second collector region 123 (e.g., at the low end of the grading) can be in a range of about $4\times10^{16}$ $cm^{-3}$ to about $9\times10^{16}$ $cm^{-3}$, which can produce the step 125. The doping concentration at the interface with the second collector region 123 (e.g., at the low end of the grading) can be about $4\times10^{16}$ $cm^{-3}$, about $5\times10^{16}$ $cm^{-3}$, about $6\times10^{16}$ $cm^{-3}$, about $7\times10^{16}$ $cm^{-3}$, about $8\times10^{16}$ $cm^{-3}$, about $9\times10^{16}$ $cm^{-3}$, or any values or ranges therebetween, although other configurations are possible outside these ranges. Various features and details of the second collector region 124 of the transistor 100 of FIG. 1B can apply to the third collector region 124 of the transistor 300 of FIG. 3B. The doping concentration at the high end of the grading can be about $5\times10^{16}$ $cm^{-3}$, about $6\times10^{16}$ $cm^{-3}$, about $7\times10^{16}$ $cm^{-3}$, about $8\times10^{16}$ $cm^{-3}$, about $9\times10^{16}$ $cm^{-3}$, about $1\times10^{17}$ $cm^{-3}$, about $2\times10^{17}$ $cm^{-3}$, about $3\times10^{17}$ $cm^{-3}$, about $4\times10^{17}$ $cm^{-3}$, about $5\times10^{17}$ $cm^{-3}$, or more, or any values or ranges between any of these values (e.g., between $1\times10^{17}$ $cm^{-3}$ and $5\times10^{17}$ $cm^{-3}$), although other configurations are possible. In some embodiments, the maximum doping concentration of the third collector region 124 can be about two orders of magnitude lower than the doping concentration of the sub-collector 108, or one order of magnitude lower.

The step 125 or discontinuity can increase the safe operating area (SOA) and/or improve the ruggedness of the transistor 300. The discontinuity can be used to compensate for the increase in the collector transit time that can come with using a thicker collector 120, so that the transistor 300 can be used to provide improved ruggedness without degrading the performance parameter(s).

The step 125 can be a difference between the flat doping concentration at the second collector region 123 and the low end of the graded doping concentration of the third collector region 124. The difference in the doping concentrations that produce the step 125 can be in a range of about $2.5\times10^{16}$ $cm^{-3}$ to about $8.25\times10^{16}$ $cm^{-3}$. The step 125 can have a step up value of about $2\times10^{16}$ $cm^{-3}$, about $3\times10^{16}$ $cm^{-3}$, about $4\times10^{16}$ $cm^{-3}$, about $5\times10^{16}$ $cm^{-3}$, about $6\times10^{16}$ $cm^{-3}$, about $7\times10^{16}$ $cm^{-3}$, about $8\times10^{16}$ $cm^{-3}$, about $9\times10^{16}$ $cm^{-3}$, or more, or any values or ranges between any of these values, although other configurations are possible. The height of the step 125 can be lower than the amount of doping concentration increase along the grading of the third collector region 124, although in some embodiments, the step 125 could be larger or the same size as the doping concentration increase along the grading. The collector 120 can have a step or discontinuity at the transition between the first collector region 122 and the second collector region 123. Thus, the second collector region 123, which can have a flat doping concentration, can have step or discontinuities at both ends. The step 125 can be smaller than the step between the first collector region 122 and the second collector region 123.

As shown in the legend 150 of FIG. 3A, the bipolar transistor 300 can be formed of substantially the same materials as the bipolar transistor 100, with a different doping profile in the collector 120. Many variations are possible. A bipolar transistor can have a collector thickness configured to provide good ruggedness, as discussed herein. The transistor can include any combination of the features disclosed herein, which in some embodiments can at least partially compensate for a relatively thick collector. First, in some embodiments, the collector can have a higher doping concentration (e.g., for a graded collection region), which can at least partially compensate for degradation to the transition frequency ($f_T$) from the thicker collector. Second, in some embodiments, the collector can include a region of high doping concentration (e.g., a doping spike) adjacent to the base (or between the base and the graded region of the collector), which can be used to compensate for the thick collector, such as by improving linearity. Third, in some embodiments, the collector can include a step at the transition between flat doped collector region and a graded collector region, and that discontinuity can be used to adjust the transition frequency ($f_T$) to maintain performance parameters (e.g., linearity, gain, and/or efficiency) of the transistor with a large collector thickness for improved ruggedness, for example. Any combination of these three parameters can be used to produce transistors with beneficial performance (e.g., RF performance) and improved ruggedness, and each of these three parameters can be omitted in some implementations. In some cases, any combination of these three parameters can be used to tune performance of a transistor or associated power amplifier, even without using a collector with increased thickness.

FIG. 4A is a graph that shows measurements taken from experimental results for a state of the art transistor (shown as a solid line 206) and for a transistor having the design of transistor 300 in FIG. 3B (shown as a dashed line 208). For the power amplifier corresponding to line 206 in FIG. 4A, the voltage can increase to about 12 V as the current increases, at which point a breakdown causes the voltage (Vce) to reduce as the current continues to increase above the threshold. By comparison, for a power amplifier corresponding to line 208, which uses a transistor 300 having features disclosed herein, the voltage can increase to about 25 V as the current increases, at which point the breakdown causes the voltage (Vce) to reduce as the current increases. For line 206, the snapback current is at about 1.2 mA, and for line 208, the snapback point is at about 3.75 mA. Thus, the transistor design of FIG. 3B can shift the snapback point upward and to the top right in the graph of FIG. 4A, which can increase the safe operating area (SOA). The transistor designs disclosed herein can defer the snapback and can increase the ruggedness of power amplifiers.

Figure 4B:
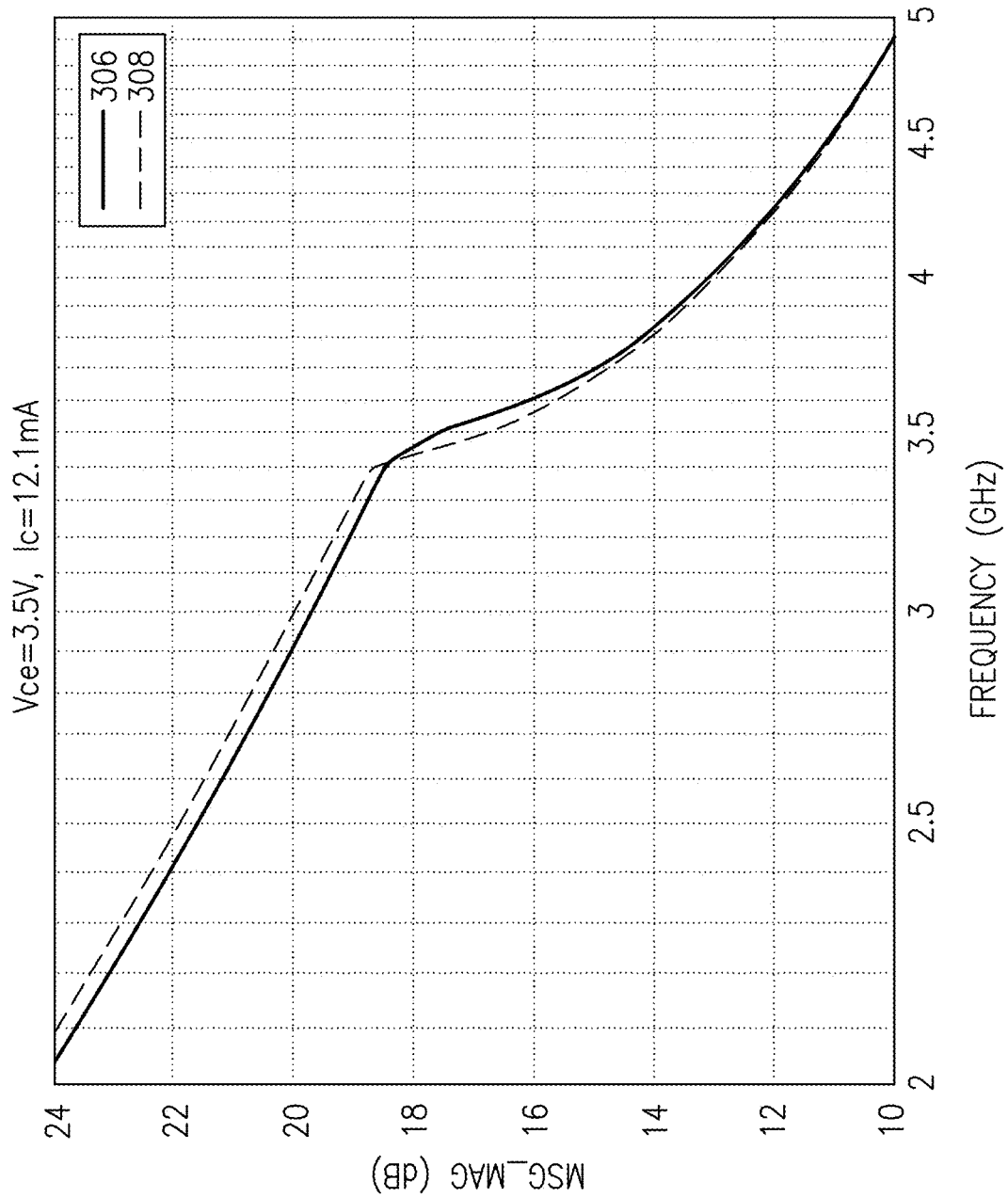
FIG. 4B is a graph of experimental data that shows substantially no degradation in the RF gain of a bipolar transistor of FIG. 3B over a state of the art bipolar transistor.

FIG. 4B compares the RF gain of the transistor 300 (corresponding to line 308) of FIG. 3B and that of a state of the art transistor (corresponding to line 306) and confirms no substantial performance degradation due to the design of the transistor 300 (e.g., increased collector thickness, doping spike, doping concentration discontinuity, and/or higher doping concentration at the first end of second collector region 124).

To determine how the transistors disclosed herein can increase the usable voltage range and output power range of a given power amplifier, the limits of the safe operating range can be characterized with a series of measurements. An example characterization sequence is shared for a common-emitter GaAs HBT amplifier: Initially set the power supply Vcc to the nominal voltage (which might be 4.5V, 5.0V, or 5.5V), then set the RF input power to +10 dBm, and then sweep the output mismatch ratio from 1:1 to 10:1 on the output over all possible phase angles. The output will be significantly overdriven and electrical stress will increase as the output VSWR in increased. After each sweep of VSWR, the voltage at Vcc is stepped progressively higher (e.g., in increments of 0.1V or similar) until the power amplifier fails.

It should be noted that the ruggedness testing could be performed without additional over-drive protection circuitry on the power amplifier, but in some instance this may not be practical as when protection circuitry is present. The protection circuitry can effectively expand the safe operating range. Thus, ruggedness characterization of an amplifier can factor in both the SOA of the GaAs-based HBT transistors and, where applicable, the effectiveness of the protection circuitry to prevent or delay failure in the event of a stress event. For example, some power amplifiers can have protection features that can limit or cut-off operation when a stress event occurs. The transistors disclosed herein can withstand higher stresses, and the protection features can be set to limit operation at higher threshold values (e.g., of voltage and/or power). In an example, if the peak power of an existing PA needs to be increased from 32 dBm to 36 dBm, the protection circuitry threshold voltage cutoff should also be increased from 5V to 5.2 volts, 5.3 volts, 5.5 volts, or 5.7 volts, or any values or ranges therebetween, although other configurations are possible. Also, in the event of a stress event that invokes the protection features, the transistors disclosed herein can be more likely to survive the stress event because of the improved ruggedness relative to the current state-of-the-art transistors.

Common-emitter amplifier stages designed and optimized for handset applications using some transistors are used in applications with Vcc up to 5.5V, in some cases. In practice, the amplifier and any associated protection circuitry, can exceed this specification by a sufficient margin and over the full range of temperatures requested by the handset manufacturer. As a possible guideline, one could strive to demonstrate no failures at 5% or higher Vcc (5.25V) over a full range VSWR and temperature. The worst case temperature can be, for example, at −30 deg C. where the amplifier gain can be expected to be the highest. This can be the lowest temperature test case that a handset manufacturers may request in the analysis, in some cases. In the context of a similar common-emitter based mobile handset amplifier alternatively built with transistors 100 in FIG. 1B, applications will be able to support Vcc at least about 10% higher than the current-state-of-the-art: up to 6V (or greater). When also taking into account sufficient margin on ruggedness limits, as before, the amplifier can demonstrate ruggedness at least 5% higher at Vcc=6.3V with characterization including −30 deg C., for example.

Figure 4C:
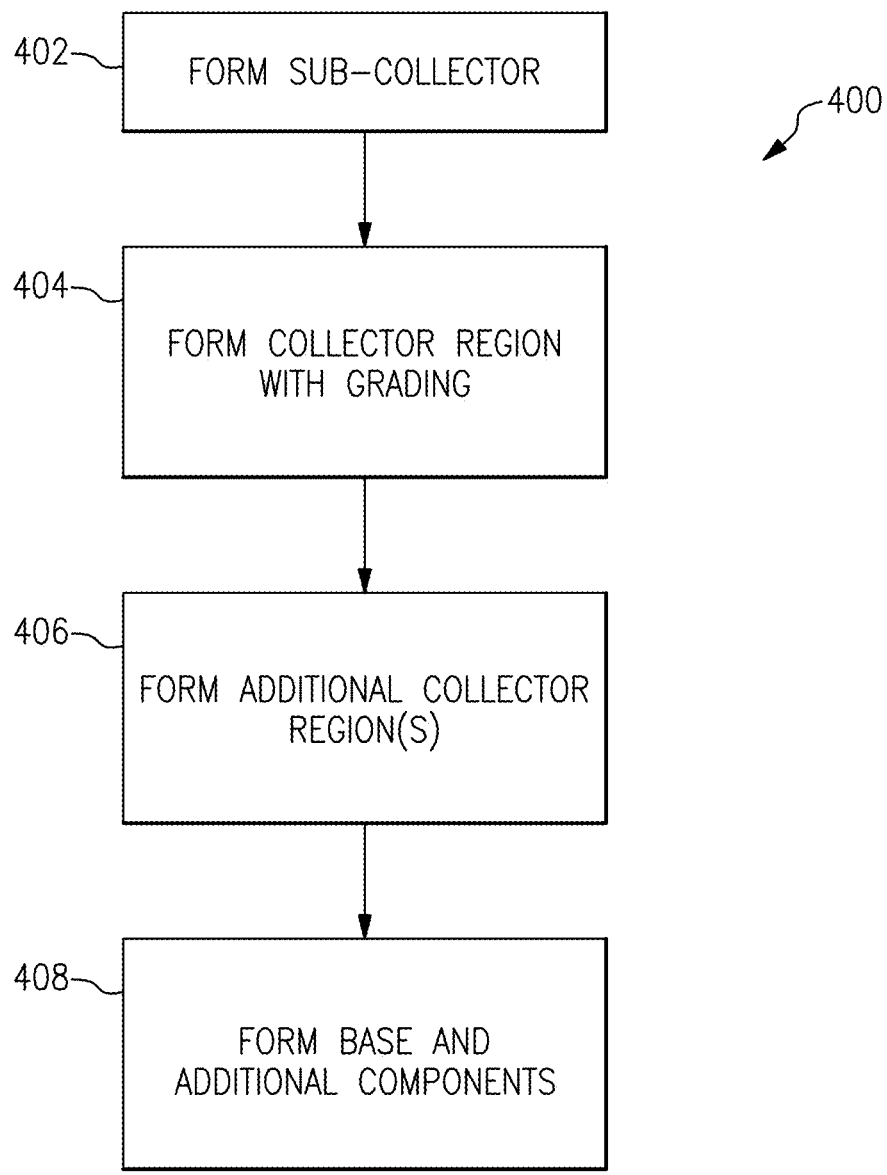
FIG. 4C is an illustrative flow diagram of making a bipolar transistor according to an embodiment.

FIG. 4C is an example flow diagram of a process 400 of forming a bipolar transistor according to some embodiments. It will be understood that any of the processes discussed herein may include greater or fewer operations and the operations may be performed in any order, as appropriate. Further, one or more acts of the process can be performed either serially or in parallel. The process 400 can be performed while forming the bipolar transistor 100 of FIG. 1A, the bipolar transistor 300 of FIG. 3A, or any other suitable bipolar transistor disclosed herein, or any combination thereof. At block 402, a sub-collector of a bipolar transistor is formed (e.g., over the substrate). The sub-collector can include any combination of features of the sub-collectors described herein, for example, the sub-collector 108. A collector region can be formed that includes at least one grading at block 404. The at least one grading can be formed by any suitable doping method. The collector region can be adjacent the sub-collector, for example, directly over the sub-collector in the orientation of FIGS. 1B and 3B. The collector region can include any combination of features described herein with reference to the collector regions 122, 123, and/or 124. The collector can increase the ruggedness of the bipolar transistor (in some cases while maintaining performance values), as discussed herein. For example, a relatively high doping level at the collector can compensate for a relatively large collector thickness, to provide good ruggedness and good performance. At block 406 additional collector region(s) are formed, such as by doping different regions differently. The method can include forming the base, and other additional components, at block 408.

Figure 5:
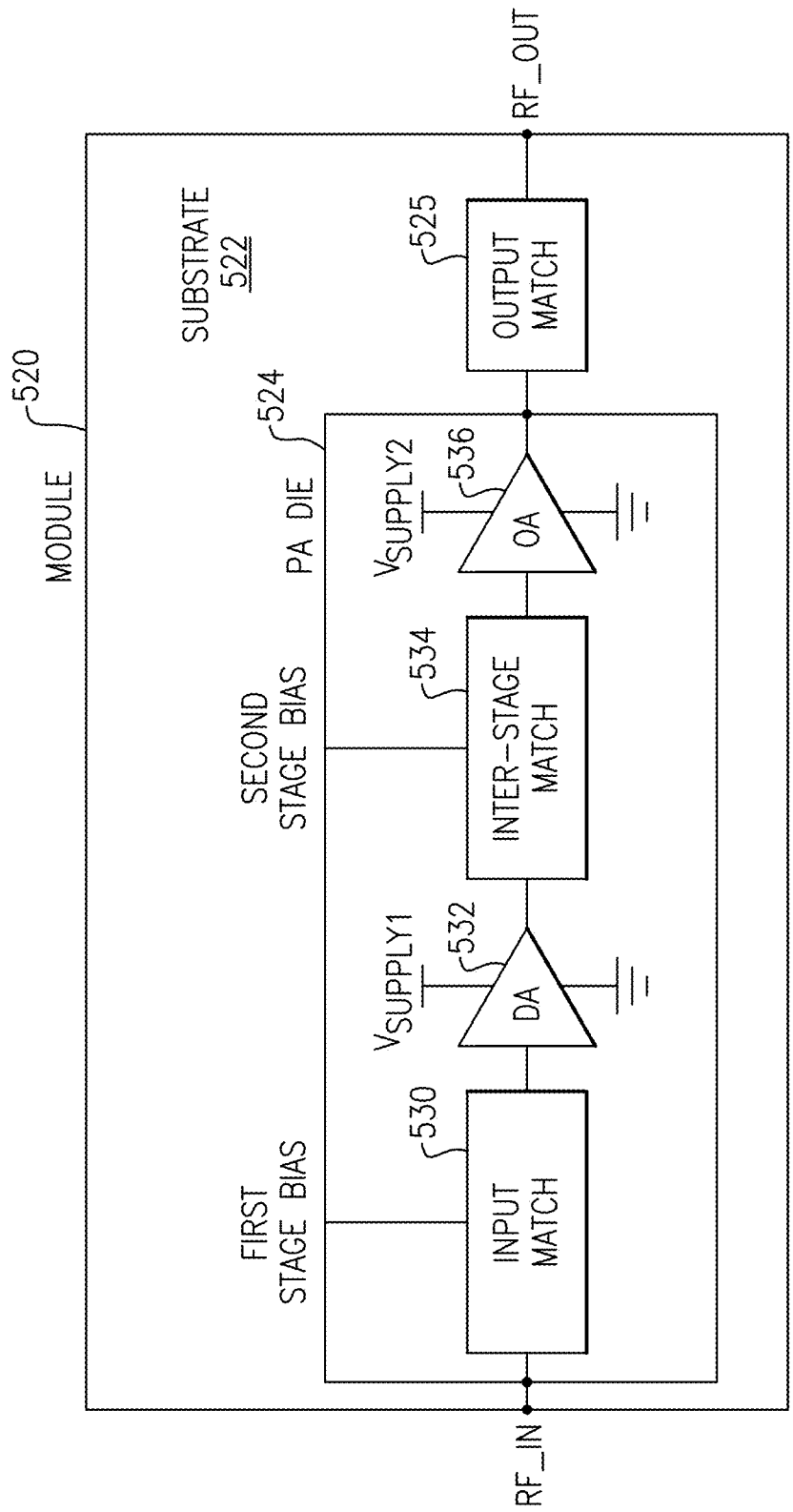
FIG. 5 is an illustrative block diagram of a power amplifier module that includes a bipolar transistor with one or more features described herein.

FIG. 5 is a schematic block diagram of a module 520 that can include one or more bipolar transistors 100 of FIG. 1B, one or more bipolar transistors 300 of FIG. 3B, or any other suitable bipolar transistors disclosed herein, or any combination thereof. The module 520 can be some or all of a power amplifier system. The module 520 can be referred to as multi-chip module and/or a power amplifier module in some implementations. The module 520 can include a substrate 522 (for example, a packaging substrate), a die 524 (for example, a power amplifier die), a matching network 525, the like, or any combination thereof. Although not illustrated, the module 520 can include one or more other dies and/or one or more circuit elements that coupled to the substrate 522 in some implementations. The one or more other dies can include, for example, a controller die, which can include a power amplifier bias circuit and/or a direct current-to-direct current (DC-DC) converter. Example circuit element(s) mounted on the packaging substrate can include, for example, inductor(s), capacitor(s), impedance matching network(s), the like, or any combination thereof.

The module 520 can include a plurality of dies and/or other components mounted on and/or coupled to the substrate 522 of the module 520. In some implementations, the substrate 522 can be a multi-layer substrate configured to support the dies and/or components and to provide electrical connectivity to external circuitry when the module 520 is mounted on a circuit board, such as a phone board.

The power amplifier die 524 can receive a RF signal at an input pin RF_IN of the module 520. The power amplifier die 524 can include one or more power amplifiers, including, for example, multi-stage power amplifiers configured to amplify the RF signal. The power amplifier die 524 can include an input matching network 530, a first stage power amplifier 532 (which can be referred to as a driver amplifier (DA)), an inter-stage matching network 534, a second stage power amplifier 536 (which can be referred to as an output amplifier (OA)), or any combination thereof.

A power amplifier can include the first stage power amplifier 532 and the second stage power amplifier 536. The first stage power amplifier 532 and/or the second stage power amplifier 536 can include one or more bipolar transistors 100 of FIG. 1B, one or more bipolar transistors 300 of FIG. 3B, one or more other bipolar transistors disclosed herein, or any combination thereof. Moreover, the bipolar transistors disclosed herein can help meet the power module 520 and/or the power amplifier die 524 to meet any of the ruggedness, safe operating area (SOA), or performance specifications described herein.

The RF input signal can be provided to the first stage power amplifier 532 via the input matching network 530. The matching network 530 can receive a first stage bias signal. The first bias signal can be generated on the PA die 524, outside of the PA die 524 in the module 520, or external to the module 520. The first stage power amplifier 532 can amplify the RF input and provide the amplified RF input to the second stage power amplifier 536 via the inter-stage matching circuit 534. The inter-stage matching circuit 534 can receive a second stage bias signal. The second stage bias signal can be generated on the PA die 524, outside of the PA die 524 in the module 520, or external to the module 520. The second stage power amplifier 536 can generate the amplified RF output signal.

The amplified RF output signal can be provided to an output pin RF_OUT of the power amplifier die 524 via an output matching network 525. The matching network 525 can be provided on the module 520 to aid in reducing signal reflections and/or other signal distortions. The power amplifier die 524 can be any suitable die. In some implementations, the power amplifier 524 die is a gallium arsenide (GaAs) die. In some of these implementations, the GaAs die has transistors formed using a heterojunction bipolar transistor (HBT) process.

The module 520 can also include one or more power supply pins, which can be electrically connected to, for example, the power amplifier die 524. The one or more power supply pins can provide supply voltages to the power amplifiers, such as $V_{SUPPLY1}$ and $V_{SUPPLY2}$, which can have different voltage levels in some implementations. The module 520 can include circuit element(s), such as inductor(s), which can be formed, for example, by a trace on the multi-chip module. The inductor(s) can operate as a choke inductor, and can be disposed between the supply voltage and the power amplifier die 524. In some implementations, the inductor(s) are surface mounted. Additionally, the circuit element(s) can include capacitor(s) electrically connected in parallel with the inductor(s) and configured to resonate at a frequency near the frequency of a signal received on the pin RF_IN. In some implementations, the capacitor(s) can include a surface mounted capacitor.

The module 520 can be modified to include more or fewer components, including, for example, additional power amplifier dies, capacitors and/or inductors. For instance, the module 520 can include one or more additional matching networks 525. As another example, the module 520 can include an additional power amplifier die, as well as an additional capacitor and inductor configured to operate as a parallel LC circuit disposed between the additional power amplifier die and the power supply pin of the module 520. The module 520 can be configured to have additional pins, such as in implementations in which a separate power supply is provided to an input stage disposed on the power amplifier die 520 and/or implementations in which the module 520 operates over a plurality of bands.

The module 520 can have a low voltage positive bias supply of about 3.2 V to 4.2 V, good linearity, high efficiency (for example, PAE of approximately 40% at 28.25 dBm), large dynamic range, high ruggedness, suitable gain, a small and low profile package (for example, 3 mm×3 mm×0.9 mm with a 10-pad configuration), power down control, support low collector voltage operation, digital enable, not require a reference voltage, CMOS compatible control signals, an integrated directional coupler, or any combination thereof.

In some implementations, the module 520 is a power amplifier module that is a fully matched 10-pad surface mount module developed for Wideband Code Division Multiple Access (WCDMA) applications. This small and efficient module can pack full 1920-1980 MHz bandwidth coverage into a single compact package. Because of high efficiencies attained throughout the entire power range, the module 520 can deliver desirable talk-time advantages for mobile phones. The module 520 can meet the stringent spectral linearity requirements of High Speed Downlink Packet Access (HSDPA), High Speed Uplink Packet Access (HSUPA), and Long Term Evolution (LTE) data transmission with high power added efficiency. A directional coupler can be integrated into the module 520 and can thus eliminate the need for an external coupler.

The die 524 can be a power amplifier die embodied in a single Gallium Arsenide (GaAs) Microwave Monolithic Integrated Circuit (MMIC) that includes all active circuitry of the module 520, such as one or more the bipolar transistors 100 of FIG. 1A, one or more bipolar transistors 300A of FIG. 3A, one or more bipolar transistors 300B of FIG. 3D, or any combination thereof. The MMIC can include on-board bias circuitry, as well as input matching network 530 and inter-stage matching network 534. An output matching network 525 can have a 50 ohm load that is embodied separate from the die 524 within the package of the module 520 to increase and/or optimize efficiency and power performance.

The module 520 can be manufactured with a GaAs-based Heterojunction Bipolar Transistor (HBT) BiFET process that provides for all positive voltage DC supply operation while maintaining high efficiency and good linearity. The Module can provide good ruggedness while maintaining performance metrics. Primary bias to the module 520 can be supplied directly or via an intermediate component from any three-cell Ni—Cd battery, a single-cell Li-Ion battery, or other suitable battery with an output in the range selected from about 3.2 to 4.2 V. No reference voltage is needed in some implementations. Power down can be accomplished by setting an enable voltage to zero volts. No external supply side switch is needed as typical "off" leakage is a few microamperes with full primary voltage supplied from the battery, according to some implementations.

Figure 6:
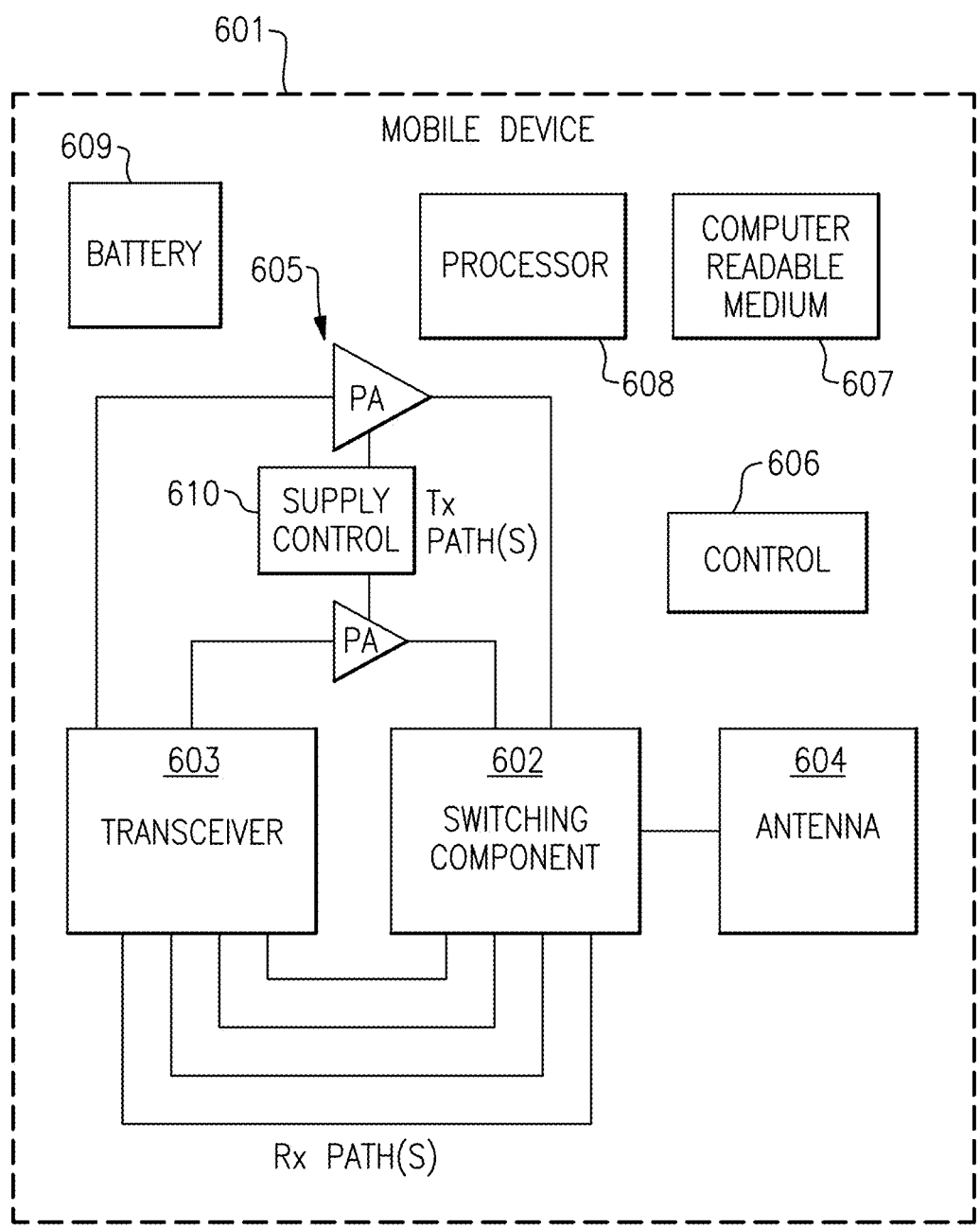
FIG. 6 is an illustrative block diagram of a mobile or fixed wireless communication device that includes the power amplifier module of FIG. 5.

Any of the devices, systems, methods, and apparatus described herein can be implemented in a variety of electronic devices, such as a mobile device, which can also be referred to as a wireless device. FIG. 6 is a schematic block diagram of an example mobile device 601 that can include one or more bipolar transistors 100 of FIG. 1B, one or more bipolar transistors 300 of FIG. 3B, or any other transistors disclosed herein, or any combination thereof.

Examples of the mobile device 601 can include, but are not limited to, a cellular phone (for example, a smart phone), a laptop, a tablet computer, a personal digital assistant (PDA), an electronic book reader, and a portable digital media player. For instance, the mobile device 101 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

In certain embodiments, the mobile device 601 can include one or more of a switching component 602, a transceiver component 603, an antenna 604, power amplifiers 605 that can include one or more bipolar transistors 100 of FIG. 1B, one or more bipolar transistors 300 of FIG. 3B, one or more other bipolar transistors disclosed herein, a control component 606, a computer readable medium 607, a processor 608, a battery 609, and supply control block 610.

The transceiver component 603 can generate RF signals for transmission via the antenna 604. Furthermore, the transceiver component 603 can receive incoming RF signals from the antenna 604.

It will be understood that various functionalities associated with the transmission and receiving of RF signals can be achieved by one or more components that are collectively represented in FIG. 6 as the transceiver 603. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 6 as the antenna 604. For example, a single antenna can be configured to provide both transmitting and receiving functionalities. In another example, transmitting and receiving functionalities can be provided by separate antennas. In yet another example, different bands associated with the mobile device 601 can be provided with different antennas.

In FIG. 6, one or more output signals from the transceiver 603 are depicted as being provided to the antenna 604 via one or more transmission paths. In the example shown, different transmission paths can represent output paths associated with different bands and/or different power outputs. For instance, the two example power amplifiers 605 shown can represent amplifications associated with different power output configurations (e.g., low power output and high power output), and/or amplifications associated with different bands.

In FIG. 6, one or more detected signals from the antenna 604 are depicted as being provided to the transceiver 603 via one or more receiving paths. In the example shown, different receiving paths can represent paths associated with different bands. For example, the four example paths shown can represent quad-band capability that some mobile devices 601 are provided with.

To facilitate switching between receive and transmit paths, the switching component 602 can be configured to electrically connect the antenna 604 to a selected transmit or receive path. Thus, the switching component 602 can provide a number of switching functionalities associated with an operation of the mobile device 601. In certain embodiments, the switching component 602 can include a number of switches configured to provide functionalities associated with, for example, switching between different bands, switching between different power modes, switching between transmission and receiving modes, or some combination thereof. The switching component 602 can also be configured to provide additional functionality, including filtering of signals. For example, the switching component 602 can include one or more duplexers.

The mobile device 601 can include one or more power amplifiers 605. RF power amplifiers can be used to boost the power of a RF signal having a relatively low power. Thereafter, the boosted RF signal can be used for a variety of purposes, including driving the antenna of a transmitter. Power amplifiers 605 can be included in electronic devices, such as mobile phones, to amplify a RF signal for transmission. For example, in mobile phones having an architecture for communicating under the 3G, 4G, and/or 5G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 6 shows that in certain embodiments, a control component 606 can be provided, and such a component can include circuitry configured to provide various control functionalities associated with operations of the switching component 602, the power amplifiers 605, the supply control 610, and/or other operating component(s).

In certain embodiments, a processor 608 can be configured to facilitate implementation of various functionalities described herein. Computer program instructions associated with the operation of any of the components described herein may be stored in a computer-readable memory 607 that can direct the processor 608, such that the instructions stored in the computer-readable memory produce an article of manufacture including instructions which implement the various operating features of the mobile devices, modules, etc. described herein.

The illustrated mobile device 601 also includes the supply control block 610, which can be used to provide a power supply to one or more power amplifiers 605. For example, the supply control block 610 can include a DC-to-DC converter. However, in certain embodiments the supply control block 610 can include other blocks, such as, for example, an envelope tracker configured to vary the supply voltage provided to the power amplifiers 605 based upon an envelope of the RF signal to be amplified.

The supply control block 610 can be electrically connected to the battery 609, and the supply control block 610 can be configured to vary the voltage provided to the power amplifiers 605 based on an output voltage of a DC-DC converter. The battery 609 can be any suitable battery for use in the mobile device 601, including, for example, a lithium-ion battery. With at least one power amplifier 605 that includes one or more bipolar transistors 100 of FIG. 1B, one or more bipolar transistors 300 of FIG. 3B, one or more other bipolar transistors disclosed herein, or any combination thereof, the power consumption of the battery 109 can be reduced and/or the reliability of the power amplifier 605 can be improved, thereby improving performance of the mobile device 601.

Some of the embodiments described above have provided examples in connection with modules and/or electronic devices that include power amplifiers, such as mobile phones. However, the principles and advantages of the embodiments can be used for any other systems or apparatus that have needs for a bipolar transistor with a high level of second channel linearity without sacrificing RF gain.

Systems implementing one or more aspects of the present disclosure can be implemented in various electronic devices. Examples of electronic devices can include, but are not limited to, consumer electronic products, parts of the consumer electronic products, electronic test equipment, etc. More specifically, electronic devices configured implement one or more aspects of the present disclosure can include, but are not limited to, an RF transmitting device, any portable device having a power amplifier, a mobile phone (for example, a smart phone), a telephone, a base station, a femtocell, a radar, a device configured to communication according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module including an RF transmission line, a power amplifier module, an integrated circuit including an RF transmission line, a substrate including an RF transmission line, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled," "connected," and the like, as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments is not intended to be exhaustive or to limit the invention to the precise form disclosed above. While specific embodiments of, and examples for, the invention are described above for illustrative purposes, For example, while processes or blocks are presented in a given order, alternative embodiments may perform routines having acts, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

While certain embodiments of the inventions have been described, these embodiments have been presented by way of example only, and are not intended to limit the scope of the disclosure. For example, various equivalent modifications are possible within the scope of the invention, as those skilled in the relevant art will recognize. Moreover, the elements and acts of the various embodiments described above can be combined to provide further embodiments. Indeed, the methods, systems, apparatus, and articles of manufacture described herein may be embodied in a variety of other forms; furthermore, various omissions, substitutions and changes in the form of the methods, systems, apparatus, and articles of manufacture described herein may be made without departing from the spirit of the disclosure. The accompanying claims and their equivalents are intended to cover such forms or modifications as would fall within the scope and spirit of the disclosure.

What is claimed is:

1. A bipolar transistor comprising:
   an emitter;
   a base; and
   a collector having a first collector region and a second collector region, the first collector region between the base and the second collector region, the first collector region having a flat doping concentration, the second collector region having a graded doping concentration that increases along a direction away from the base, a transition from the flat doping concentration of the first collector region to the graded doping concentration of the second collector region having a step increase in the doping concentration, the collector having an additional collector region between the base and the first collector region, and the additional collector region having a doping concentration that is higher than the doping concentrations of the first collector region and the second collector region.

2. The bipolar transistor of claim 1, wherein the step has a doping concentration increase of at least about $2\times10^{16}$ $cm^{-3}$.

3. The bipolar transistor of claim 1, wherein the step has a doping concentration increase in a range of about $2.5\times10^{16}$ $cm^{-3}$ to about $8.25\times10^{16}$ $cm^{-3}$.

4. The bipolar transistor of claim 1, wherein there is a step decrease in the doping concentration across the transition from the additional collector region and the first collector region.

5. The bipolar transistor of claim 1, wherein the collector has a thickness of more than 1.1 microns.

6. The bipolar transistor of claim 1, wherein the collector has a thickness in a range from about 1.2 microns to about 1.5 microns.

7. The bipolar transistor of claim 1, wherein the second collector region has maximum doping concentration that is larger than $9\times10^{16}$ $cm^{-3}$.

8. The bipolar transistor of claim 1, wherein the second collector region has a maximum doping concentration that is in a range of about $1\times10^{17}$ $cm^{-3}$ to about $5\times10^{17}$ $cm^{-3}$.

9. The bipolar transistor of claim 1, wherein a maximum doping concentration of the second collector region is at least 13 times greater than a doping concentration of the first collector region.

10. The bipolar transistor of claim 1, wherein the second collector region has a thickness of at least about 0.7 microns.

11. The bipolar transistor of claim 1, wherein the first collector region and the second collector region have a combined thickness in a range from about 1.2 microns to about 1.5 microns.

12. The bipolar transistor of claim 1, wherein the second collector region has a maximum doping concentration that is in a range of about $1.5\times10^{17}$ $cm^{-3}$ to about $5\times10^{17}$ $cm^{-3}$.

13. A bipolar transistor comprising:
    an emitter;
    a base; and
    a collector, the base between the collector and the emitter, the collector having a gradient doping concentration and a discontinuity between the gradient doping concentration and a lower doping concentration, the collector having a doping spike having a doping concentration that is higher than the gradient doping concentration, the lower doping concentration between the doping spike and the gradient doping concentration.

14. The bipolar transistor of claim 13, wherein the discontinuity includes a step in the doping concentration of at least about $2\times10^{16}$ $cm^{-3}$.

15. The bipolar transistor of claim 13, wherein the discontinuity includes a step in the doping concentration in a range of about $2.5\times10^{16}$ $cm^{-3}$ to about $8.25\times10^{16}$ $cm^{-3}$.

16. The bipolar transistor of claim 13, wherein the collector has a discontinuity between the doping spike and the lower doping concentration.

17. The bipolar transistor of claim 13, wherein the collector has a thickness of more than 1.1 microns.

18. The bipolar transistor of claim 13, wherein the collector has a thickness in a range from about 1.2 microns to about 1.5 microns.

19. The bipolar transistor of claim 13, wherein the gradient doping concentration has a maximum doping concentration that is larger than $9\times10^{16}$ $cm^{-3}$.

20. The bipolar transistor of claim 13, wherein the gradient doping concentration has a maximum doping concentration that is in a range of about $1\times10^{17}$ $cm^{-3}$ to about $5\times10^{17}$ $cm^{-3}$.

21. The bipolar transistor of claim 13, wherein the gradient doping concentration has a maximum doping concentration that is at least 13 times greater than the lower doping concentration.

22. The bipolar transistor of claim 13, further comprising a sub-collector, the collector between the base and the sub-collector.

23. The bipolar transistor of claim 13, wherein the bipolar transistor is a heterojunction bipolar transistor (HBT).

24. The bipolar transistor of claim 13, wherein the bipolar transistor is a GaAs-based transistor.

25. A power amplifier comprising a bipolar transistor of claim 13.

26. A mobile or fixed wireless device comprising an antenna, a battery, and the power amplifier of claim 24.

27. The bipolar transistor of claim 13, wherein a region of the collector that has the gradient doping concentration has a thickness of at least about 0.7 microns.

28. The bipolar transistor of claim 13, wherein the gradient doping concentration has a maximum doping concentration that is in a range of about $1.5\times10^{17}$ $cm^{-3}$ to about $5\times10^{17}$ $cm^{-3}$.

* * * * *